(12) United States Patent
Togawa et al.

(10) Patent No.: US 10,343,252 B2
(45) Date of Patent: Jul. 9, 2019

(54) POLISHING APPARATUS FOR DETECTING ABNORMALITY IN POLISHING OF A SUBSTRATE

(71) Applicant: EBARA CORPORATION, Tokyo (JP)

(72) Inventors: Tetsuji Togawa, Tokyo (JP); Masaya Seki, Tokyo (JP); Hiroyuki Takenaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 162 days.

(21) Appl. No.: 15/654,594

(22) Filed: Jul. 19, 2017

(65) Prior Publication Data

US 2017/0312879 A1 Nov. 2, 2017

Related U.S. Application Data

(62) Division of application No. 14/987,434, filed on Jan. 4, 2016, now Pat. No. 9,782,869, which is a division of application No. 14/034,488, filed on Sep. 23, 2013, now Pat. No. 9,248,543.

(30) Foreign Application Priority Data

Sep. 24, 2012 (JP) .................. 2012-209499

(51) Int. Cl.
*B24B 9/06* (2006.01)
*B24B 21/00* (2006.01)
*B24B 37/005* (2012.01)
(52) U.S. Cl.
CPC ............ *B24B 37/005* (2013.01); *B24B 9/065* (2013.01); *B24B 21/002* (2013.01)

(58) Field of Classification Search
CPC .. B24B 9/065; B24B 9/10; B24B 9/14; B24B 9/107; B24B 9/148; B24B 21/002; B24B 37/005; B24B 49/02; B24B 49/04
See application file for complete search history.

(56) References Cited

U.S. PATENT DOCUMENTS

| | | | |
|---|---|---|---|
| 5,895,314 A | 4/1999 | Kitao et al. | |
| 6,332,828 B1 | 12/2001 | Hasegawa et al. | |
| 6,336,057 B1 | 1/2002 | Obayashi | |
| 6,402,596 B1 | 6/2002 | Hakomori et al. | |

(Continued)

FOREIGN PATENT DOCUMENTS

| JP | 2003-285266 A | 10/2003 |
|---|---|---|
| JP | 2006-066891 A | 3/2006 |

(Continued)

*Primary Examiner* — Timothy V Eley
(74) *Attorney, Agent, or Firm* — Baker & Hostetler LLP

(57) ABSTRACT

An apparatus for detecting an abnormality in polishing of an edge portion of a substrate is provided. The apparatus includes: a substrate holder configured to rotate the substrate; a pressing device configured to press a polishing tool against the edge portion of the substrate to polish the edge portion; a measuring device configured to measure a position of the polishing tool relative to a surface of the substrate; and a controller configured to determine an amount of polishing of the substrate from the position of the polishing tool, calculate a polishing rate from the amount of polishing of the substrate, and judge that an abnormality in polishing of the edge portion of the substrate has occurred if the polishing rate is out of a predetermined range.

14 Claims, 30 Drawing Sheets

(56) References Cited

U.S. PATENT DOCUMENTS

| | | |
|---|---|---|
| 6,629,875 B2 | 10/2003 | Steere |
| 7,018,275 B2 | 3/2006 | Zuniga et al. |
| 8,210,905 B2 | 7/2012 | Sakairi |
| 2007/0232203 A1 | 10/2007 | Fukuda et al. |
| 2012/0252320 A1 | 10/2012 | Seki |
| 2014/0213155 A1 | 7/2014 | Togawa et al. |
| 2015/0104620 A1 | 4/2015 | Takahashi et al. |
| 2017/0291273 A1* | 10/2017 | Kashiwagi .............. B24B 51/00 |

FOREIGN PATENT DOCUMENTS

| | | |
|---|---|---|
| TW | 466153 B | 12/2001 |
| TW | I352645 | 11/2011 |
| TW | I368555 | 7/2012 |

* cited by examiner

| WAFER ANGLE | POLISHING WIDTH (μm) | AMOUNT OF POLISHING (μm) | AVERAGE POLISHING RATE (μm/min) | DIFFERENCE (μm) | ERROR (%) |
|---|---|---|---|---|---|
| 90° | 441 | 200 | 34.3 | 0.0 | 0.0 |
| 180° | 403 | 204 | 35.0 | 4.0 | 2.0 |
| 270° | 373 | 202 | 34.6 | 2.0 | 1.0 |
| AVERAGE | 406 | 202 | 34.6 | 2.0 | 1.0 |

| WAFER ANGLE | POLISHING WIDTH ($\mu$m) | AMOUNT OF POLISHING ($\mu$m) | AVERAGE POLISHING RATE ($\mu$m/min) | DIFFERENCE ($\mu$m) | ERROR (%) |
|---|---|---|---|---|---|
| 90° | 466 | 205 | 37.3 | 5.0 | 2.5 |
| 180° | 423 | 206 | 37.5 | 6.0 | 3.0 |
| 270° | 391 | 199 | 36.2 | -1.0 | -0.5 |
| AVERAGE | 427 | 203 | 37.0 | 3.3 | 1.7 |

| WAFER ANGLE | POLISHING WIDTH ($\mu$m) | AMOUNT OF POLISHING ($\mu$m) | AVERAGE POLISHING RATE ($\mu$m/min) | DIFFERENCE ($\mu$m) | ERROR (%) |
|---|---|---|---|---|---|
| 90° | 453 | 196 | 41.1 | -4.0 | -2.0 |
| 180° | 412 | 200 | 42.0 | 0.0 | 0.0 |
| 270° | 373 | 186 | 39.0 | -14.0 | -7.0 |
| AVERAGE | 413 | 194 | 40.7 | -6.0 | -3.0 |

| WAFER ANGLE | POLISHING WIDTH ($\mu$m) | AMOUNT OF POLISHING ($\mu$m) | AVERAGE POLISHING RATE ($\mu$m/min) | DIFFERENCE ($\mu$m) | ERROR (%) |
|---|---|---|---|---|---|
| 90° | 331 | 219 | 33.8 | 19.0 | 9.5 |
| 180° | 279 | 232 | 35.8 | 32.0 | 16.0 |
| 270° | 298 | 227 | 35.0 | 27.0 | 13.5 |
| AVERAGE | 303 | 226 | 34.9 | 26.0 | 13.0 |

RETREAT POSITION

TAPE EDGE DETECTING POSITION

POLISHING POSITION

POLISHING APPARATUS FOR DETECTING ABNORMALITY IN POLISHING OF A SUBSTRATE

CROSS REFERENCE TO RELATED APPLICATIONS

This application is a divisional of U.S. application Ser. No. 14/987,434 filed on Jan. 4, 2016, which is a divisional of U.S. application Ser. No. 14/034,488 filed on Sep. 23, 2013 (Issued as U.S. Pat. No. 9,248,543, granted on Feb. 2, 2016), which claims priority to Japanese Patent Application No. 2012-209499 filed Sep. 24, 2012, the entire contents of which are hereby incorporated by reference.

BACKGROUND OF THE INVENTION

Field of the Invention

The present invention relates to a method of detecting an abnormality in polishing of a substrate, such as a wafer, and a polishing apparatus. More particularly, the present invention relates to a method of detecting an abnormality in a process of polishing a peripheral portion of a substrate with a polishing tool, such as a polishing tape or a fixed abrasive.

Description of the Related Art

A polishing apparatus, which has a polishing tool (e.g., a polishing tape or a fixed abrasive), is used for polishing a peripheral portion of a wafer. This type of polishing apparatus is configured to bring the polishing tool into contact with the peripheral portion of the wafer, while rotating the wafer, to thereby polish the peripheral portion. In this specification, the peripheral portion of the wafer is defined as a region including a bevel portion which is the outermost portion of the wafer and a top edge portion and a bottom edge portion located radially inwardly of the bevel portion.

FIG. 31A and FIG. 31B are enlarged cross-sectional views each showing the peripheral portion of the wafer. More specifically, FIG. 31A shows a cross-sectional view of a so-called straight-type wafer, and FIG. 31B shows a cross-sectional view of a so-called round-type wafer. In the wafer W shown in FIG. 31A, the bevel portion is an outermost circumferential surface of the wafer W (indicated by a symbol B) that is constituted by an upper slope (an upper bevel portion) P, a lower slope (a lower bevel portion) Q, and a side portion (an apex) R. In the wafer W shown in FIG. 31B, the bevel portion is a portion B having a curved cross section and forming an outermost circumferential surface of the wafer W. The top edge portion is a flat portion E1 located radially inwardly of the bevel portion B. The bottom edge portion is a flat portion E2 located opposite the top edge portion and located radially inwardly of the bevel portion B. The top edge portion E1 and the bottom edge portion E2 may be collectively referred to as edge portion. The edge portion may include a region where devices are formed.

In a fabrication process of SOI (Silicon on Insulator) substrate, there is a need to form a vertical surface and a horizontal surface on the edge portion of the wafer W, as shown in FIG. 32. A cross section of such edge portion is achieved by a polishing process as illustrated in FIG. 33. Specifically, while the wafer W is rotated, a right-angle edge of a polishing tool 400 (e.g., a polishing tape or a fixed abrasive) is pressed against the edge portion of the wafer W to thereby polish it. The polishing tool 400 has its lower surface serving as a polishing surface that holds abrasive grains thereon. This polishing surface is disposed in parallel with the wafer W. In this state, the polishing surface of the polishing tool 400 is pressed against the edge portion of the wafer W to thereby form a right-angle cross section, i.e., the vertical surface and the horizontal surface, on the edge portion of the wafer W.

However, the edge portion of the wafer may not be polished properly due to some causes, such as aged deterioration of the polishing tool 400 or a malfunction of the polishing apparatus. Such an abnormality in polishing of the wafer would result in a lowered yield. Therefore, it is necessary to detect the abnormality in polishing of the wafer promptly. However, whether or not the edge portion of the wafer is polished properly cannot be judged until the cross section of the edge portion of the wafer is examined under a microscope.

SUMMARY OF THE INVENTION

It is an object of the present invention to provide a method and an apparatus capable of determining whether or not an edge portion of a substrate, such as a wafer, is polished properly while the substrate is being polished.

The inventors have found from wafer polishing results the fact that a polishing rate (i.e., an amount of the wafer polished or removed per unit time) when polishing of the wafer is not performed properly differs from a polishing rate when polishing of the wafer is performed properly.

An embodiment is a method of detecting an abnormality in polishing of a substrate. The method includes: rotating the substrate; pressing a polishing tool against an edge portion of the substrate to polish the edge portion; measuring a position of the polishing tool relative to a surface of the substrate when polishing the edge portion; determining an amount of polishing of the substrate from the position of the polishing tool; calculating a polishing rate from the amount of polishing of the substrate; and judging that an abnormality in polishing of the edge portion of the substrate has occurred if the polishing rate is out of a predetermined range.

Another embodiment is a polishing apparatus for polishing an edge portion of a substrate. The apparatus includes: a substrate holder configured to hold the substrate; a pressing device configured to press a polishing tool against the edge portion of the substrate; a relative-position measuring device configured to measure a position of the polishing tool relative to a surface of the substrate when polishing the edge portion; and a polishing controller configured to determine an amount of polishing of the substrate from the position of the polishing tool, calculate a polishing rate from the amount of polishing of the substrate, and judge that an abnormality in polishing of the edge portion of the substrate has occurred if the polishing rate is out of a predetermined range.

According to the above embodiments, it is possible to determine whether or not the edge portion of the substrate is polished properly during polishing of the substrate.

DETAILED DESCRIPTION OF EMBODIMENTS

Embodiments will be described below with reference to the drawings.

Figure 1:
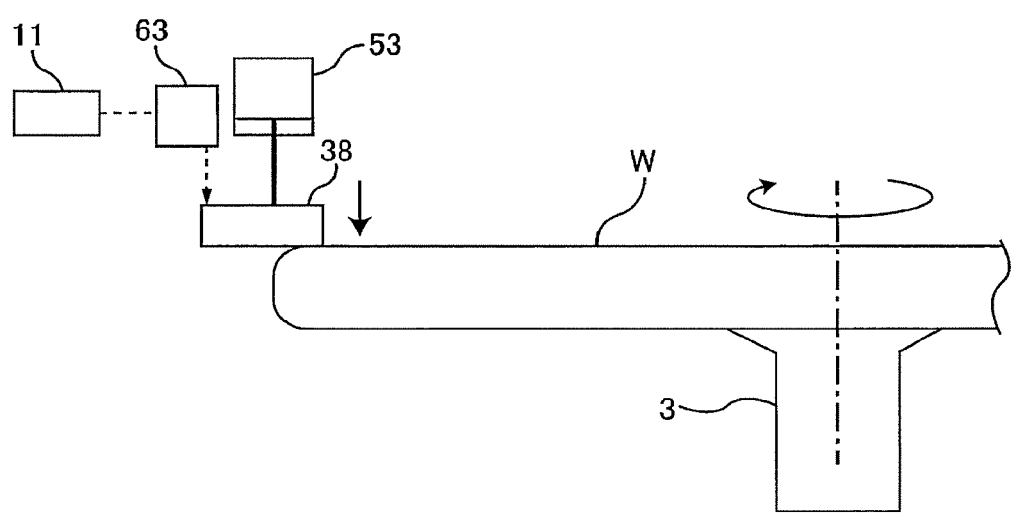
FIG. 1 is a schematic view of a polishing apparatus for performing an embodiment of a polishing method.

FIG. 1 is a schematic view of a polishing apparatus for performing an embodiment of a polishing method. The polishing apparatus includes a wafer holder (a substrate holder) 3 configured to hold a wafer W and rotate it, a polishing tool 38 configured to polish an edge portion of the wafer W, a pneumatic cylinder 53 as a pressing device configured to press the polishing tool 38 against the edge portion of the wafer W, a position sensor 63 as a relative-position measuring device configured to measure a position of the polishing tool 38 relative to a surface of the wafer W, and a polishing controller 11 configured to determine an amount of polishing of the wafer W from a measured value of the position of the polishing tool 38.

The position sensor 63 is arranged so as to measure the position of the polishing tool 38 with respect to a direction perpendicular to the surface of the wafer W. Therefore, an amount of change in the position of the polishing tool 38 from the surface of the wafer W corresponds to the amount of polishing of the wafer W. Instead of the position sensor, a displacement sensor may be used as the relative-position measuring device. The polishing tool 38 may be a polishing tape, a fixed abrasive, or the like. Instead of the pneumatic cylinder, a combination of a servomotor and a ball screw may be used as the pressing device 53.

Figure 2:
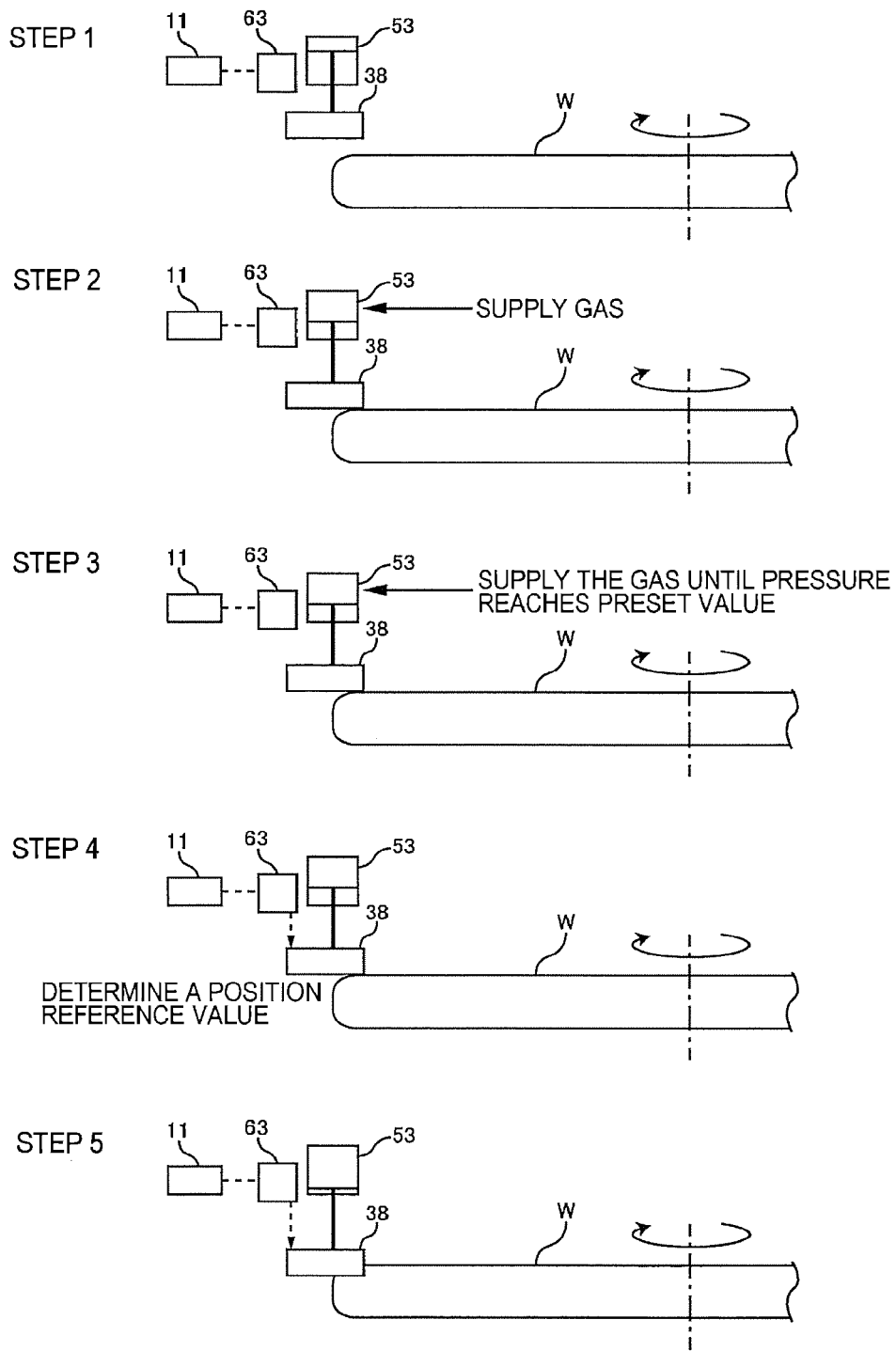
FIG. 2 is a view illustrating the embodiment of the polishing method.

FIG. 2 is a view illustrating the embodiment of the polishing method. The polishing tool 38 is arranged such that its polishing surface is in parallel with the surface of the wafer W and the polishing surface faces the edge portion of the wafer W. Polishing of the wafer W is performed as follows. In step 1, the wafer W is rotated by the wafer holder 3. In step 2, a gas is supplied into the pneumatic cylinder 53 from a gas supply device (not shown) so that the polishing tool 38 is moved toward the wafer W until the polishing surface of the polishing tool 38 is brought into contact with the edge portion of the wafer W. In step 3, the gas is further supplied into the pneumatic cylinder 53 until pressure of the gas in the pneumatic cylinder 53 reaches a preset value.

In step 4, the position sensor 63 measures the position of the polishing tool 38 for a predetermined initial measurement time while the pressure of the gas in the pneumatic cylinder 53 is kept at the above-described preset value. This initial measurement time is a time required for measured values of the position of the polishing tool 38 to become stable, and is determined beforehand through previous wafer polishing processes and/or experiments. The polishing controller 11 is configured to calculate an average of the measured values obtained during the initial measurement time and define this average of the measured values as a position reference value. This position reference value is a value indicating a surface position of the wafer W, and therefore the amount of polishing of the wafer W can be expressed by an amount of movement (or a distance) of the polishing tool 38 from the position reference value.

The polishing tool 38 is pressed against the edge portion of the wafer W by the pneumatic cylinder 53, so that the edge portion of the wafer W is polished as shown in step 5. The polishing tool 38 has a right-angle edge, which is pressed downwardly against the edge portion of the wafer W. The polishing surface of the polishing tool 38 is a horizontal surface parallel with the wafer surface. This horizontal polishing surface is pressed against the edge portion of the wafer W to thereby form a vertical surface and a horizontal surface on the edge portion of the wafer W.

As the polishing tool 38 polishes the edge portion of the wafer W, the position of the polishing tool 38 changes. An amount of change in the position of the polishing tool 38 corresponds to the amount of polishing of the edge portion of the wafer W. Therefore, the polishing controller 11 can determine the amount of polishing of the edge portion of the wafer W from the measured value of the position of the polishing tool 38 obtained by the position sensor 63. More specifically, a difference (which is an absolute value) between a current measured value and the above-described position reference value is determined to be the current amount of polishing. This amount of polishing is expressed as a thickness of the wafer W removed by the polishing tool 38, i.e., a polishing depth. The polishing controller 11 terminates polishing of the edge portion of the wafer W by the polishing tool 38 when the determined amount of polishing reaches a predetermined target amount of polishing.

Figure 7:
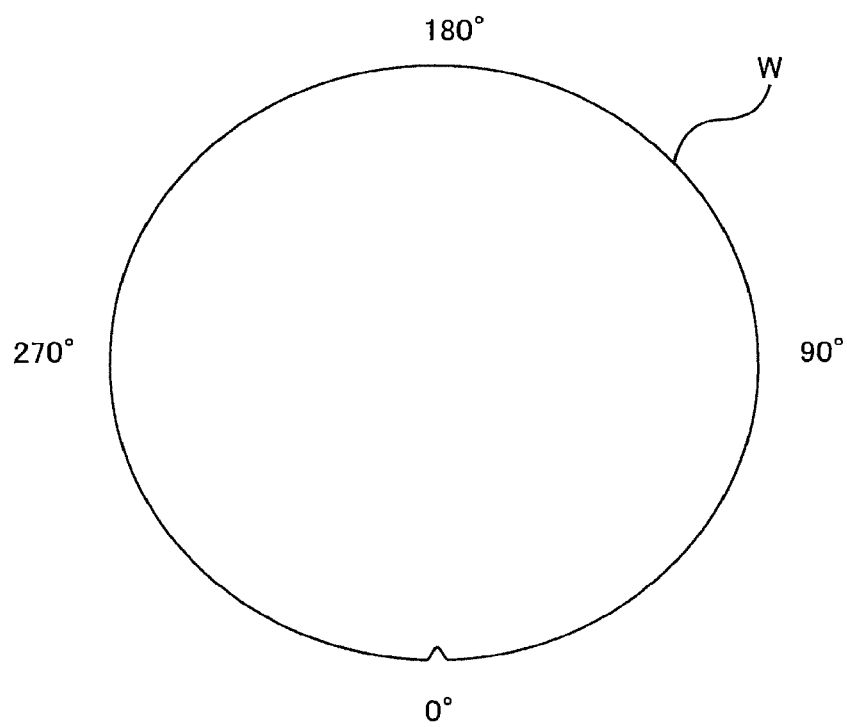
FIG. 7 is a view for illustrating a wafer angle shown in FIG. 6.

FIG. 3 through FIG. 6 show cross-sectional views of the edge portion of the polished wafer and further show examples of polishing data. In FIG. 3 through FIG. 6, a polishing width represents a width of a wafer portion polished by the polishing tool 38, and the amount of polishing represents an amount (i.e., a depth) of the wafer polished (or removed) by the polishing tool 38, an average polishing rate represents an average amount of polishing (or an average polishing depth) per unit time throughout the whole polishing time, a difference represents a difference between the target amount of polishing and an actual amount of polishing, and an error represents a value obtained by dividing the difference by the target amount of polishing. A wafer angle represents a circumferential angle from a notch (i.e., a cutout) formed on the wafer W as shown in FIG. 7. The circumferential angle of the notch is defined as 0 degree.

Figure 3:
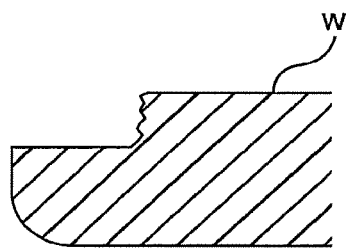
FIG. 3 shows a cross-sectional view of an edge portion of a polished wafer and further shows an example of polishing data.
Figure 3:
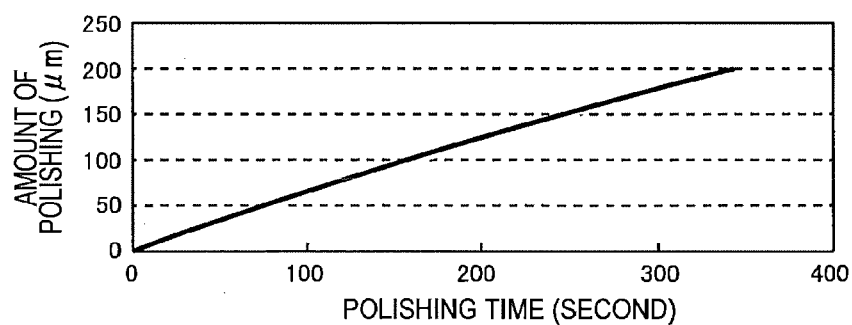
Figure 4:
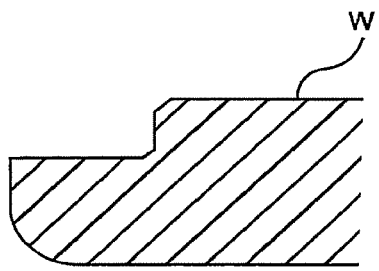
FIG. 4 shows a cross-sectional view of the edge portion of the polished wafer and further shows another example of polishing data.
Figure 4:
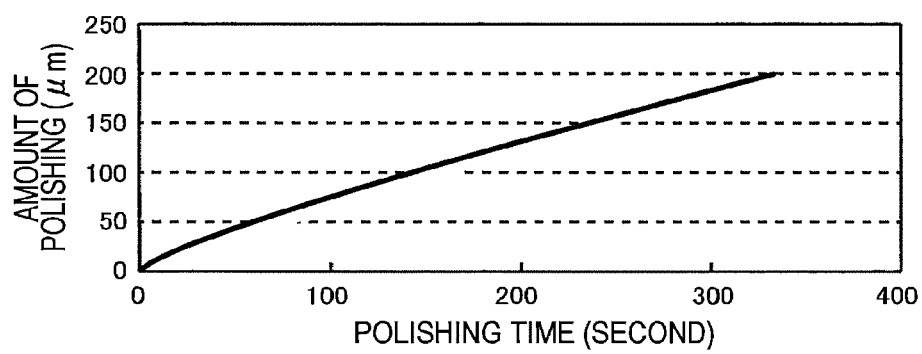
Figure 5:
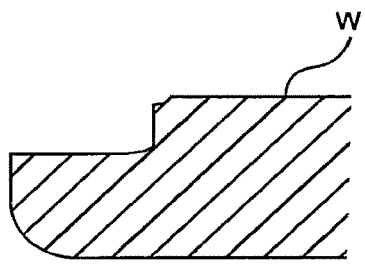
FIG. 5 shows a cross-sectional view of the edge portion of the polished wafer and further shows still another example of polishing data.
Figure 5:
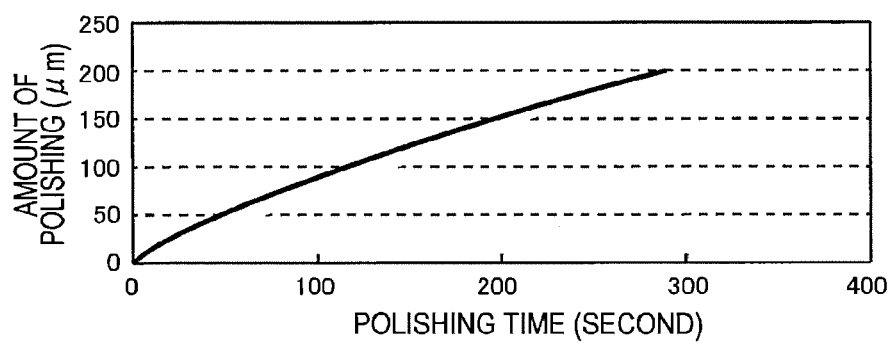
Figure 6:
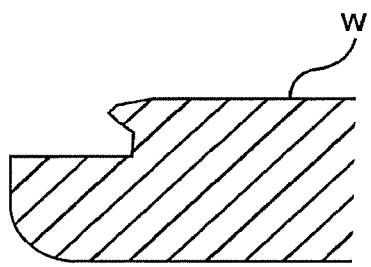
FIG. 6 shows a cross-sectional view of the edge portion of the polished wafer and further shows still another example of polishing data.
Figure 6:
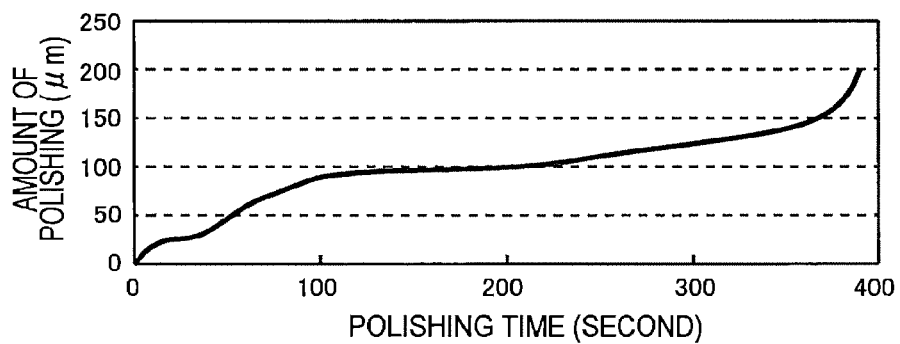

In FIG. 3 through FIG. 5, the amount of polishing increases at approximately a constant rate throughout the whole polishing time, and the vertical surface and the horizontal surface are substantially flat. In contrast, in FIG. 6, the amount of polishing does not increase at a constant rate throughout the whole polishing time, and the vertical surface and/or the horizontal surface is not flat. It can be seen from these polishing results that, when the amount of polishing increases at approximately a constant rate throughout the whole polishing time, polishing of the edge portion of the wafer W is performed properly.

Thus, the polishing controller 11 determines, during polishing of the wafer W, the amount of polishing per predetermined time, calculates the polishing rate from the determined amount of polishing, determines whether the polishing rate falls within a predetermined range, and judges that the abnormality in polishing of the wafer W has occurred if the polishing rate is out of the predetermined range. The polishing controller 11 may judge that the abnormality in polishing of the wafer W has occurred if the number of times the polishing rate goes beyond the predetermined range reaches a predetermined number. Alternatively, the polishing controller 11 may judge that the abnormality in polishing of the wafer W has occurred if a period of time the polishing rate is out of the predetermined range exceeds a predetermined threshold value.

In the example shown in FIG. 5, the polishing rate is approximately constant throughout the entire polishing time and the polishing rate falls within the predetermined range. Therefore, the polishing controller 11 judges that polishing of the edge portion of the wafer W is performed properly. In contrast, in the example shown in FIG. 6, the polishing rate is not constant throughout the entire polishing time and the polishing rate is out of the predetermined range in some time points. Specifically, the polishing rate is approximately 0 at a point of time when 150 seconds have passed, while the polishing rate increases greatly at a point of time when 380 seconds have passed. Therefore, in this case, the polishing controller 11 judges that polishing of the edge portion of the wafer W is not performed properly.

In this manner, the polishing controller 11 can determine the occurrence of the abnormality in polishing of the wafer W while the wafer W is being polished. Therefore, the polishing controller 11 can perform real-time monitoring of the polishing of the edge portion of the wafer W. Examples of the abnormality in polishing of the wafer W include a case where a linearity showing a relationship between the amount of polishing and the polishing time is lost and a case where a total polishing rate throughout the entire polishing time is too low or too high.

As described previously, the amount of polishing can be determined from the measured value of the position of the polishing tool 38 obtained from the position sensor 63. In order to obtain the amount of polishing more accurately, the polishing controller 11 may calculate a moving average of the measured values sent from the position sensor 63 and may determine the amount of polishing from the moving average. This operation can eliminate an influence of a variation in the measured value of the position of the polishing tool 38.

When the abnormality in the wafer polishing is detected, the polishing controller 11 may terminate the polishing of the edge portion of the wafer W, and further may generate an alarm signal and transmit it to the exterior of the polishing controller 11. Further, when the abnormality in the wafer polishing is detected, the polishing controller 11 may change polishing conditions for subsequent wafers. For example, if the calculated polishing rate is smaller than the predetermined range, then the pressure applied from the polishing tool 38 to the subsequent wafers may be increased and/or the rotational speed of the subsequent wafers may be increased. In this manner, it is possible to prevent the occurrence of the abnormality in polishing of the subsequent wafers by reflecting the polishing rate, which has been calculated during polishing of the wafer W, on the polishing conditions for the subsequent wafers.

Figure 8:
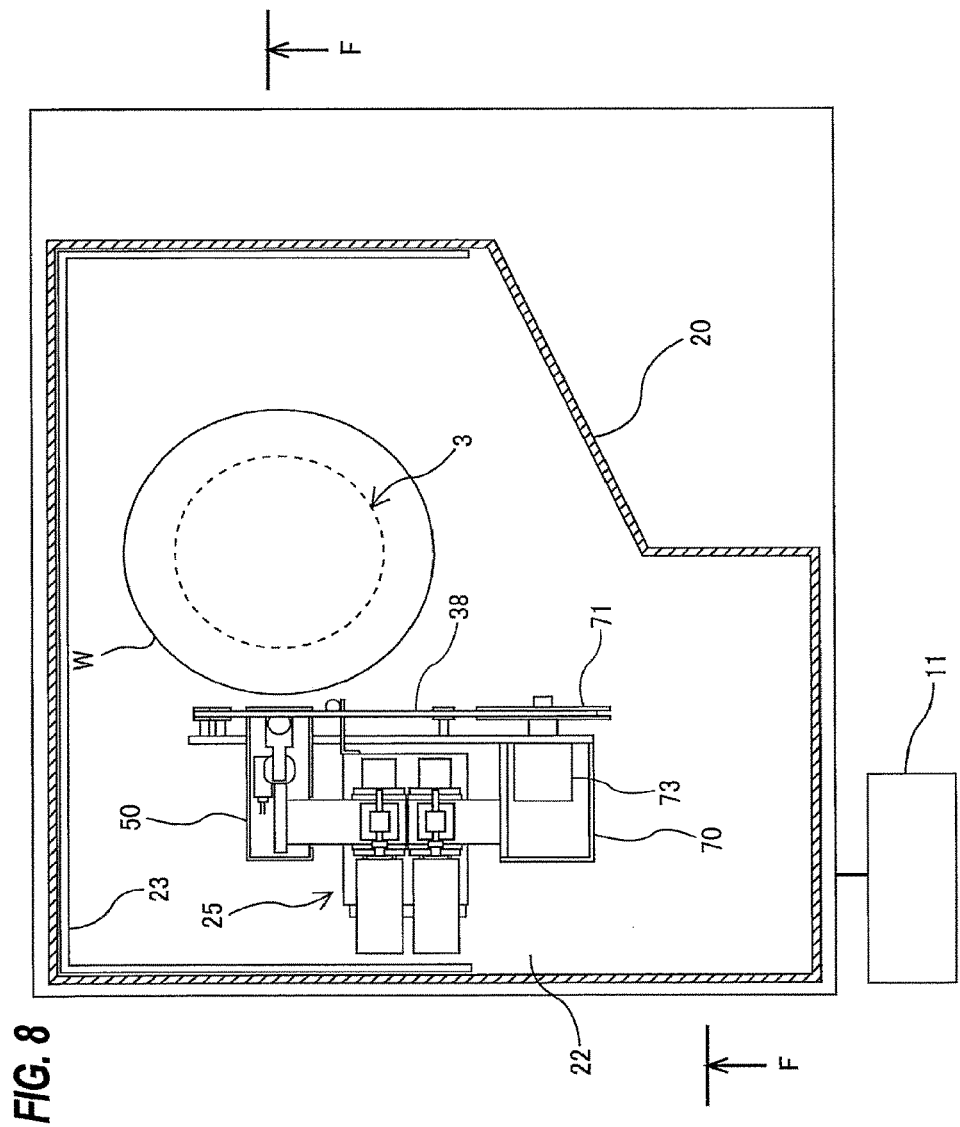
FIG. 8 is a plan view showing an embodiment of the polishing apparatus.
Figure 9:
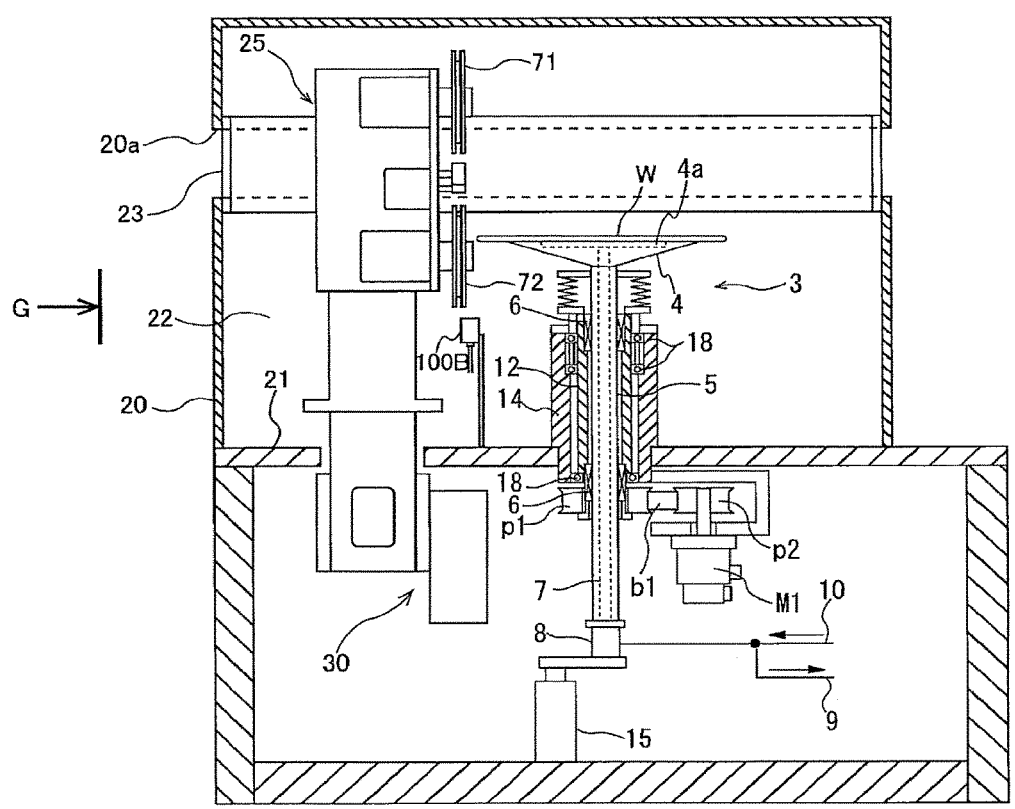
FIG. 9 is a cross-sectional view taken along line F-F in FIG. 8.
Figure 10:
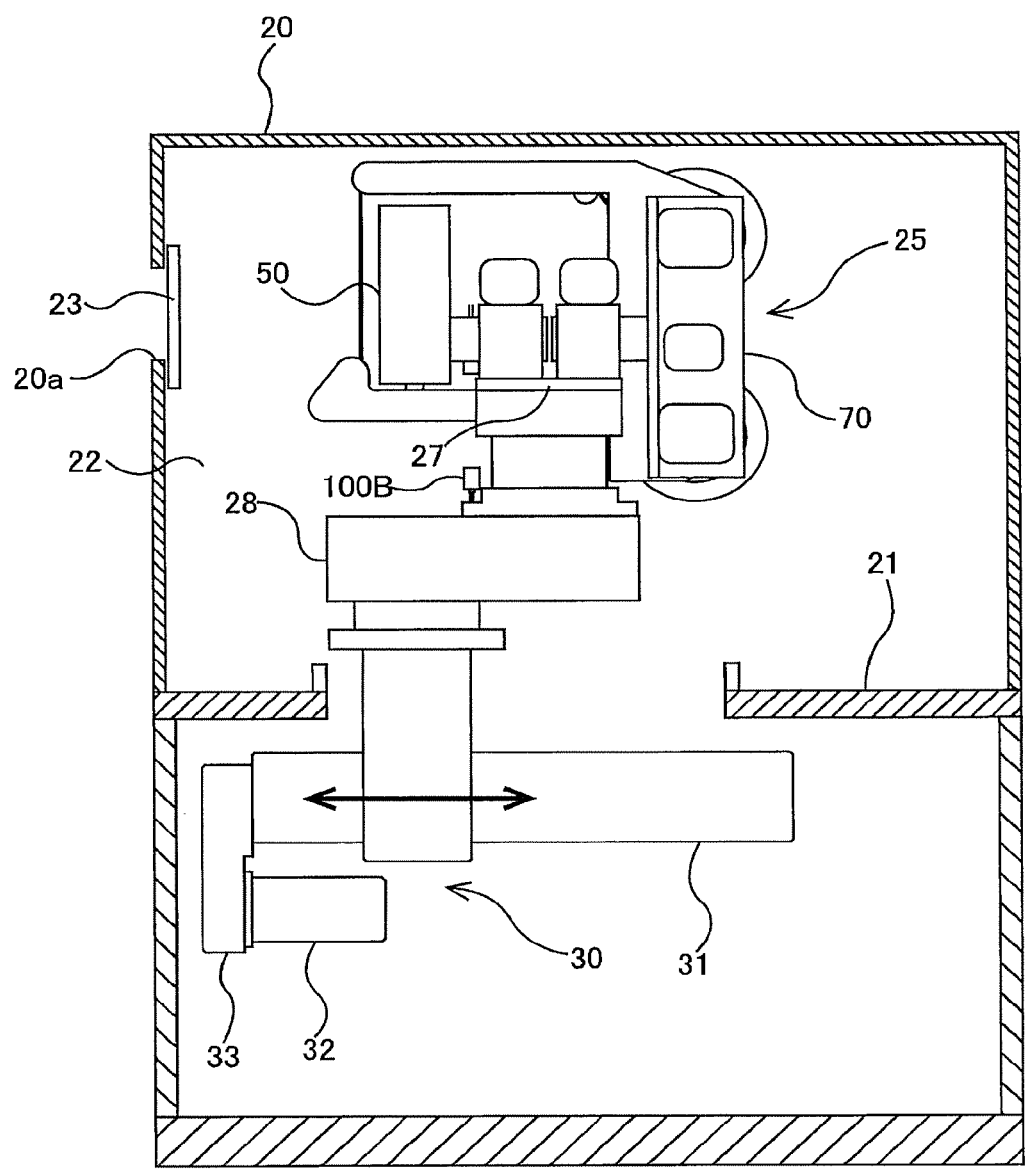
FIG. 10 is a view from a direction indicated by arrow G in FIG. 9.

Next, the details of the polishing apparatus will be described. FIG. 8 is a plan view showing a polishing apparatus according to an embodiment, FIG. 9 is a cross-sectional view taken along line F-F in FIG. 8, and FIG. 10 is a view from a direction indicated by arrow G in FIG. 9. The polishing apparatus according to the embodiment includes the wafer holder (substrate holder) 3 configured to hold the wafer (substrate) W (i.e., a workpiece to be polished) horizontally and to rotate the wafer W. FIG. 8 shows a state in which the wafer holder 3 holds the wafer W. This wafer holder 3 has a holding stage 4 configured to hold a lower surface of the wafer W by a vacuum suction, a hollow shaft 5 coupled to a central portion of the holding stage 4, and a motor M1 for rotating the hollow shaft 5. The wafer W is placed onto the holding stage 4 such that a center of the wafer W is aligned with a central axis of the hollow shaft 5.

The holding stage 4 is located in a polishing chamber 22 that is defined by a partition 20 and a base plate 21. The partition 20 has an entrance 20a through which the wafer W is transported into and removed from the polishing chamber 22. This entrance 20a is in the shape of a horizontal cutout and can be closed with a shutter 23.

The hollow shaft 5 is supported by ball spline bearings (i.e., linear motion bearings) 6 which allow the hollow shaft 5 to move vertically. The holding stage 4 has an upper surface with grooves 4a. These grooves 4a communicate with a communication passage 7 extending through the hollow shaft 5. The communication passage 7 is coupled to a vacuum line 9 via a rotary joint 8 provided on a lower end of the hollow shaft 5. The communication passage 7 is also coupled to a nitrogen-gas supply line 10 for use in releasing the wafer W from the holding stage 4 after processing. By selectively coupling the vacuum line 9 and the nitrogen-gas supply line 10 to the communication passage 7, the wafer W can be held on the upper surface of the holding stage 4 by the vacuum suction and can be released from the upper surface of the holding stage 4.

A pulley p1 is coupled to the hollow shaft 5, and a pulley p2 is mounted to a rotational shaft of the motor M1. The hollow shaft 5 is rotated by the motor M1 through the pulley p1, the pulley p2, and a belt b1 riding on these pulleys p1 and p2. The ball spline bearing 6 is a bearing that allows the hollow shaft 5 to move freely in its longitudinal direction. The ball spline bearings 6 are secured to a cylindrical casing 12. Therefore, the hollow shaft 5 can move linearly up and down relative to the casing 12, and the hollow shaft 5 and the casing 12 rotate in unison. The hollow shaft 5 is coupled to a pneumatic cylinder (elevating mechanism) 15, so that the hollow shaft 5 and the holding stage 4 are elevated and lowered by the pneumatic cylinder 15.

A cylindrical casing 14 is provided so as to surround the casing 12 in a coaxial arrangement. Radial bearings 18 are provided between the casing 12 and the casing 14, so that the casing 12 is rotatably supported by the radial bearings 18. With these structures, the wafer holder 3 can rotate the wafer W about its central axis and can elevate and lower the wafer W along its central axis.

A polishing unit 25 for polishing a peripheral portion of the wafer W is provided radially outwardly of the wafer W held by the wafer holder 3. This polishing unit 25 is located in the polishing chamber 22. As shown in FIG. 10, the polishing unit 25 in its entirety is secured to a mount base 27, which is coupled to a polishing-unit moving mechanism 30 via an arm block 28.

The polishing-unit moving mechanism 30 has a ball screw mechanism 31 that holds the arm block 28, a motor 32 for driving the ball screw mechanism 31, and a power transmission mechanism 33 that couples the ball screw mechanism 31 and the motor 32 to each other. The power transmission mechanism 33 is constructed by pulleys, a belt, and the like. As the motor 32 operates, the ball screw mechanism 31 moves the arm block 28 in directions indicated by arrows in FIG. 10 to thereby move the polishing unit 25 in its entirety in a tangential direction of the wafer W. This polishing-unit moving mechanism 30 also serves as an oscillation mechanism for oscillating the polishing unit 25 at a predetermined amplitude and a predetermined speed.

The polishing unit 25 includes a polishing head 50 for polishing the periphery of the wafer W using a polishing tape 38, and a polishing-tape supply and collection mechanism 70 for supplying the polishing tape 38 to the polishing head 50 and collecting the polishing tape 38 from the polishing head 50. The polishing head 50 is a top-edge polishing head for polishing the top edge portion of the wafer W by pressing a polishing surface of the polishing tape 38 downwardly against the peripheral portion of the wafer W. The polishing-tape supply and collection mechanism 70 also serves as a polishing-tape supporting mechanism for supporting the polishing tape 38 in parallel with the surface of the wafer W.

Figure 11:
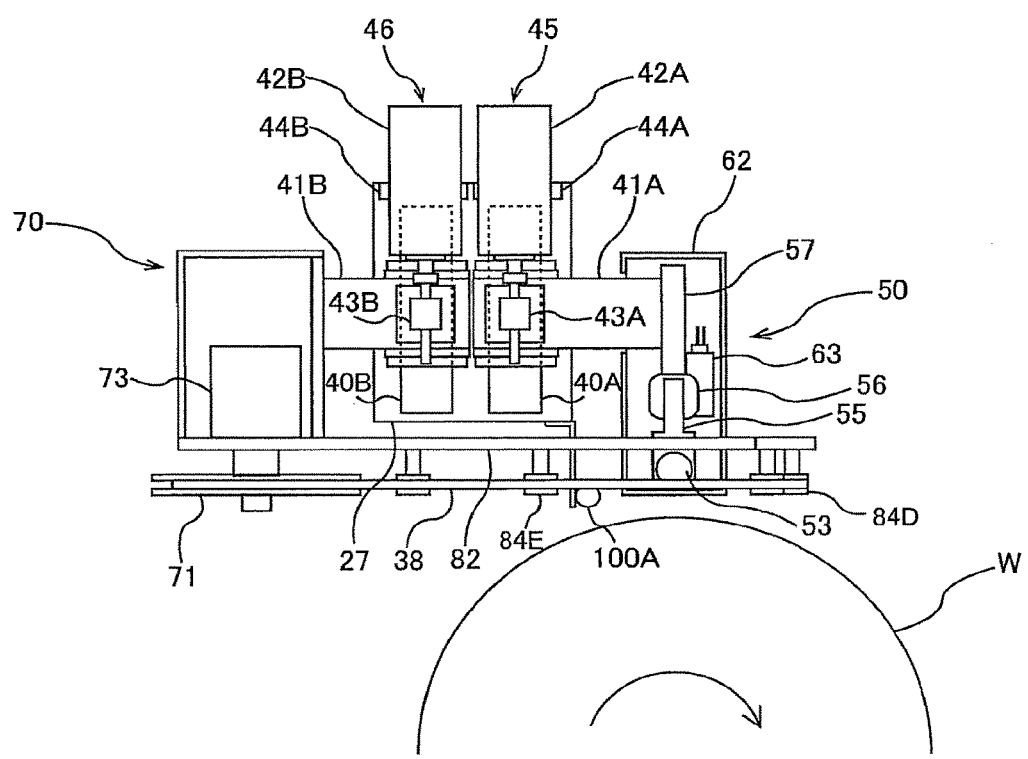
FIG. 11 is a plan view of a polishing head and a polishing-tape supply and collection mechanism.
Figure 12:
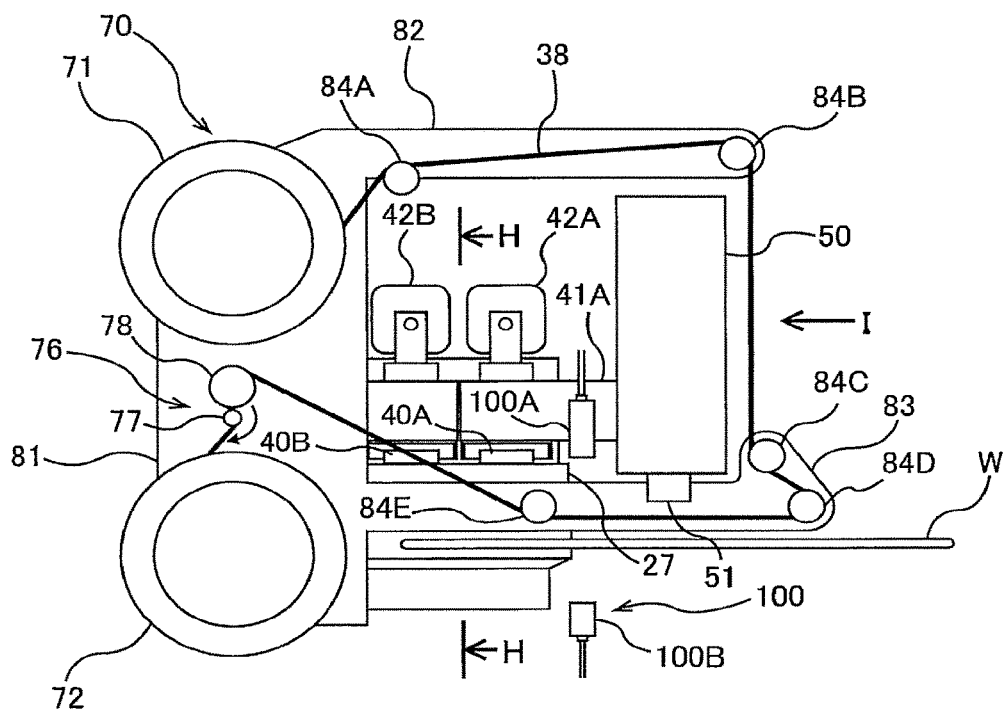
FIG. 12 is a front view of the polishing head and the polishing-tape supply and collection mechanism.
Figure 13:
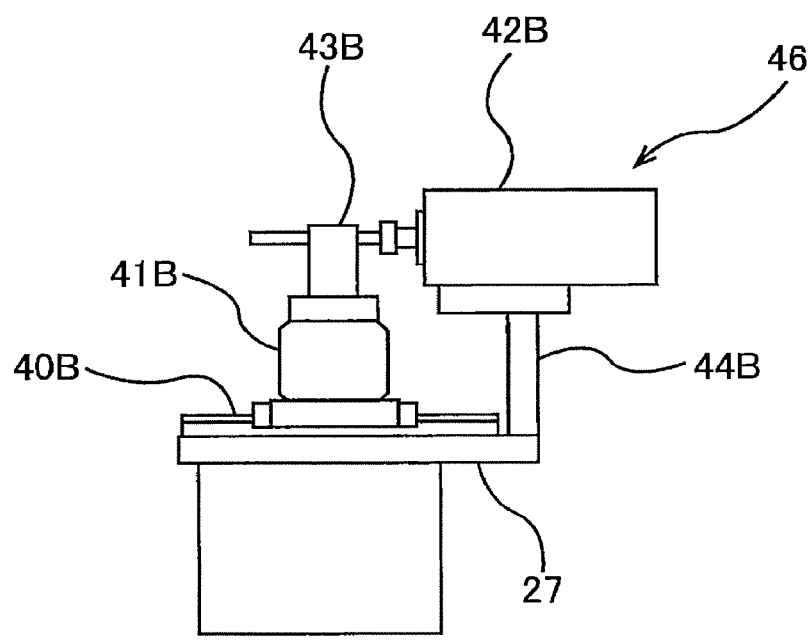
FIG. 13 is a cross-sectional view taken along line H-H in FIG. 12.
Figure 14:
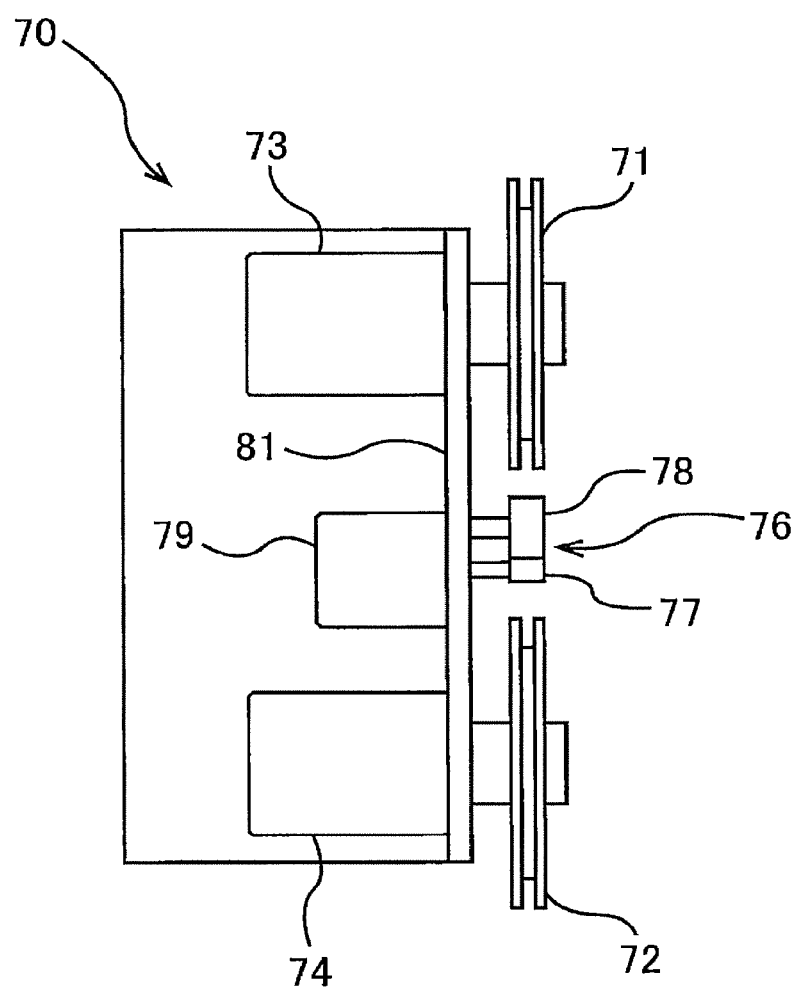
FIG. 14 is a side view of the polishing-tape supply and collection mechanism shown in FIG. 12.
Figure 15:
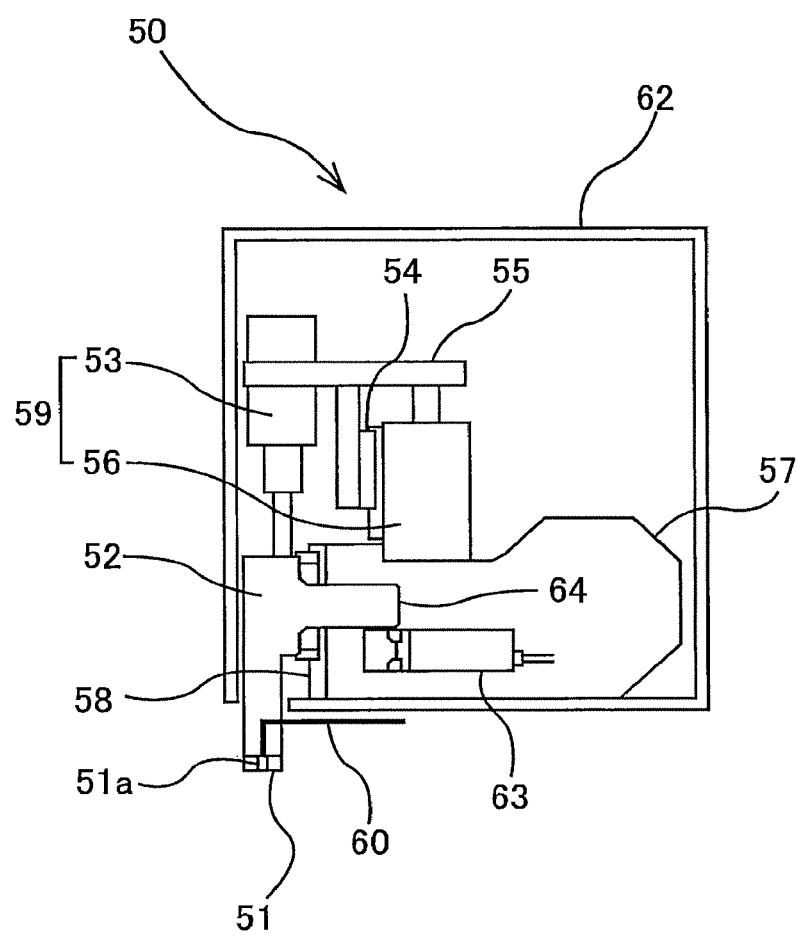
FIG. 15 is a vertical cross-sectional view of the polishing head as viewed from a direction indicated by arrow I in FIG. 12.

FIG. 11 is a plan view of the polishing head 50 and the polishing-tape supply and collection mechanism 70, FIG. 12 is a front view of the polishing head 50 and the polishing-tape supply and collection mechanism 70, FIG. 13 is a cross-sectional view taken along line H-H in FIG. 12, FIG. 14 is a side view of the polishing-tape supply and collection mechanism 70 shown in FIG. 12, and FIG. 15 is a vertical cross-sectional view of the polishing head 50 as viewed from a direction indicated by arrow I in FIG. 12.

Two linear motion guides 40A and 40B, which extend parallel to the radial direction of the wafer W, are disposed on the mount base 27. The polishing head 50 and the linear motion guide 40A are coupled to each other via a coupling block 41A. Further, the polishing head 50 is coupled to a motor 42A and a ball screw 43A for moving the polishing head 50 along the linear motion guide 40A (i.e., in the radial direction of the wafer W). More specifically, the ball screw 43A is secured to the coupling block 41A, and the motor 42A is secured to the mount base 27 through a support member 44A. The motor 42A is configured to rotate a screw shaft of the ball screw 43A, so that the coupling block 41A and the polishing head 50 (which is coupled to the coupling block 41A) are moved along the linear motion guide 40A. The motor 42A, the ball screw 43A, and the linear motion guide 40A constitute a first moving mechanism 45 for moving the polishing head 50 in the radial direction of the wafer W held on the wafer holder 3.

Similarly, the polishing-tape supply and collection mechanism 70 and the linear motion guide 40B are coupled to each other via a coupling block 41B. Further, the polishing-tape supply and collection mechanism 70 is coupled to a motor 42B and a ball screw 43B for moving the polishing-tape supply and collection mechanism 70 along the linear motion guide 40B (i.e., in the radial direction of the wafer W). More specifically, the ball screw 43B is secured to the coupling block 41B, and the motor 42B is secured to the mount base 27 through a support member 44B. The motor 42B is configured to rotate a screw shaft of the ball screw 43B, so that the coupling block 41B and the polishing-tape supply and collection mechanism 70 (which is coupled to the coupling block 41B) are moved along the linear motion guide 40B. The motor 42B, the ball screw 43B, and the linear motion guide 40B constitute a tape moving mechanism (a second moving mechanism) 46 for moving the polishing tape 38 and the polishing-tape supply and collection mechanism (i.e., the polishing-tape supporting mechanism) 70 in the radial direction of the wafer W held on the wafer holder 3.

As shown in FIG. 15, the polishing head 50 has the pressing pad 51 for pressing the polishing tape 38 against the wafer W, a pad holder 52 that holds the pressing pad 51, and the pneumatic cylinder 53 as the pressing device configured to push down the pad holder 52 (and the pressing pad 51). The pneumatic cylinder 53 is held by a holding member 55. Further, the holding member 55 is coupled to a pneumatic cylinder 56 serving as a lifter via a linear motion guide 54 extending in a vertical direction. As a gas (e.g., air) is supplied to the pneumatic cylinder 56 from a non-illustrated gas supply source, the pneumatic cylinder 56 pushes up the holding member 55, whereby the holding member 55, the pneumatic cylinder 53, the pad holder 52, and the pressing pad 51 are elevated along the linear motion guide 54.

In this embodiment, the vertically-moving mechanism 59 for moving the pressing pad 51 in the direction perpendicular to the wafer surface is constituted by the pneumatic cylinder 53 and the pneumatic cylinder 56. The motor 42A, the ball screw 43A, and the linear motion guide 40A constitute the first moving mechanism 45, which also serves as a radially-moving mechanism for moving the pressing pad 51 and the vertically-moving mechanism 59 in the radial direction of the wafer W. Further, the polishing-unit moving mechanism 30 serves as a tangentially-moving mechanism for moving the pressing pad 51 (and the pressing device 53) in the tangential direction of the wafer W.

The pneumatic cylinder 56 is secured to a mount member 57 that is fixed to the coupling block 41A. The mount member 57 and the pad holder 52 are coupled to each other via a linear motion guide 58 extending in the vertical direction. When the pad holder 52 is pushed down by the pneumatic cylinder 53, the pressing pad 51 is moved downward along the linear motion guide 58 to thereby press the polishing tape 38 against the peripheral portion of the wafer W. The pressing pad 51 is made of resin (e.g., PEEK (polyetheretherketone)), metal (e.g., stainless steel), or ceramic (e.g., SiC (silicon carbide)).

The pressing pad 51 has through-holes 51a extending in the vertical direction. A vacuum line 60 is coupled to the through-holes 51a. This vacuum line 60 has a valve (not shown in the drawings) therein. By opening this valve, a vacuum is produced in the through-holes 51a of the pressing pad 51. When the vacuum is produced in the through-holes 51a with the pressing pad 51 in contact with an upper surface of the polishing tape 38, this upper surface of the polishing tape 38 is held on a lower surface of the pressing pad 51. Only one through-hole 51a may be provided in the pressing pad 51.

The pad holder 52, the pneumatic cylinder 53, the holding member 55, the pneumatic cylinder 56, and the mount member 57 are housed in a box 62. A lower portion of the pad holder 52 projects from a bottom of the box 62, and the pressing pad 51 is attached to this lower portion of the pad holder 52. The position sensor 63 for detecting a vertical position of the pressing pad 51 is disposed in the box 62. This position sensor 63 is mounted to the mount member 57. A dog 64, which serves as a sensor target, is provided on the pad holder 52. The position sensor 63 is configured to detect the vertical position of the pressing pad 51 based on the vertical position of the dog 64.

Figure 16:
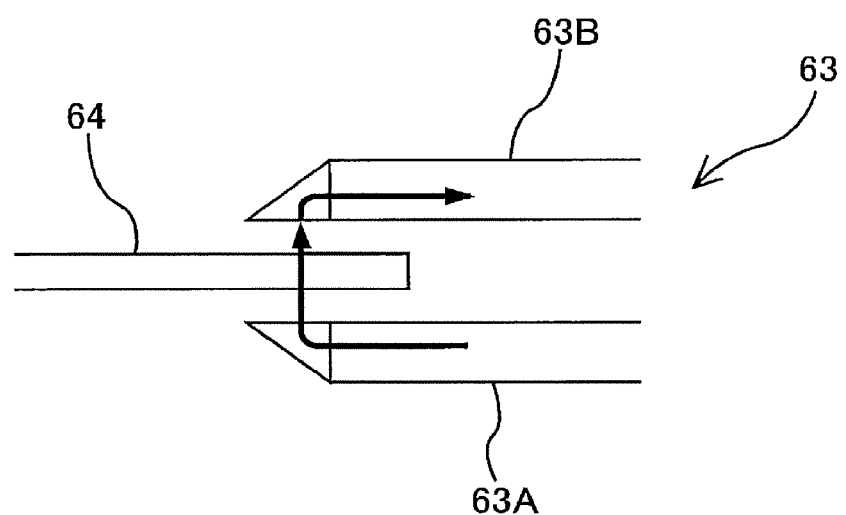
FIG. 16 is a view of a position sensor and a dog as viewed from above.

FIG. 16 is a view of the position sensor 63 and the dog 64 as viewed from above. The position sensor 63 has a light emitter 63A and a light receiver 63B. When the dog 64 is lowered together with the pad holder 52 (and the pressing pad 51), a part of light emitted from the light emitter 63A is interrupted by the dog 64. Therefore, the position of the dog 64, i.e., the vertical position of the pressing pad 51, can be detected from a quantity of the light received by the light receiver 63B. The position sensor 63 shown in FIG. 16 is a so-called transmission optical sensor. However, other type of position sensor may be used.

The polishing-tape supply and collection mechanism 70 has a supply reel 71 for supplying the polishing tape 38 and a collection reel 72 for collecting the polishing tape 38. The supply reel 71 and the collection reel 72 are coupled to tension motors 73 and 74, respectively. These tension motors 73 and 74 are configured to apply predetermined torque to the supply reel 71 and the collection reel 72 to thereby exert a predetermined tension on the polishing tape 38.

A polishing-tape advancing mechanism 76 is provided between the supply reel 71 and the collection reel 72. This polishing-tape advancing mechanism 76 has a tape-advancing roller 77 for advancing the polishing tape 38, a nip roller 78 that presses the polishing tape 38 against the tape-advancing roller 77, and a tape-advancing motor 79 for rotating the tape-advancing roller 77. The polishing tape 38 is interposed between the tape-advancing roller 77 and the nip roller 78. By rotating the tape-advancing roller 77 in a direction indicated by arrow in FIG. 12, the polishing tape 38 is advanced from the supply reel 71 to the collection reel 72.

The tension motors 73 and 74 and the tape-advancing motor 79 are mounted to a pedestal 81. This pedestal 81 is secured to the coupling block 41B. The pedestal 81 has two support arms 82 and 83 extending from the supply reel 71 and the collection reel 72 toward the polishing head 50. A plurality of guide rollers 84A, 84B, 84C, 84D, and 84E for supporting the polishing tape 38 are provided on the support arms 82 and 83. The polishing tape 38 is guided by these guide rollers 84A to 84E so as to surround the polishing head 50.

The extending direction of the polishing tape 38 is perpendicular to the radial direction of the wafer W as viewed from above. The two guide rollers 84D and 84E, which are located below the polishing head 50, support the polishing tape 38 such that the polishing surface of the polishing tape 38 is parallel to the surface (upper surface) of the wafer W. Further, the polishing tape 38 extending between these guide rollers 84D and 84E is parallel to the tangential direction of the wafer W. There is a gap in the vertical direction between the polishing tape 38 and the wafer W.

The polishing apparatus further has a tape-edge detection sensor 100 for detecting a position of the edge of the polishing tape 38. This tape-edge detection sensor 100 is a transmission optical sensor, as well as the above-described position sensor 63. The tape-edge detection sensor 100 has a light emitter 100A and a light receiver 100B. The light emitter 100A is secured to the mount base 27 as shown in FIG. 11, and the light receiver 100B is secured to the base plate 21 that defines the polishing chamber 22 as shown in FIG. 9. This tape-edge detection sensor 100 is configured to detect the position of the edge of the polishing tape 38 based on a quantity of the light received by the light receiver 100B.

Figure 17:
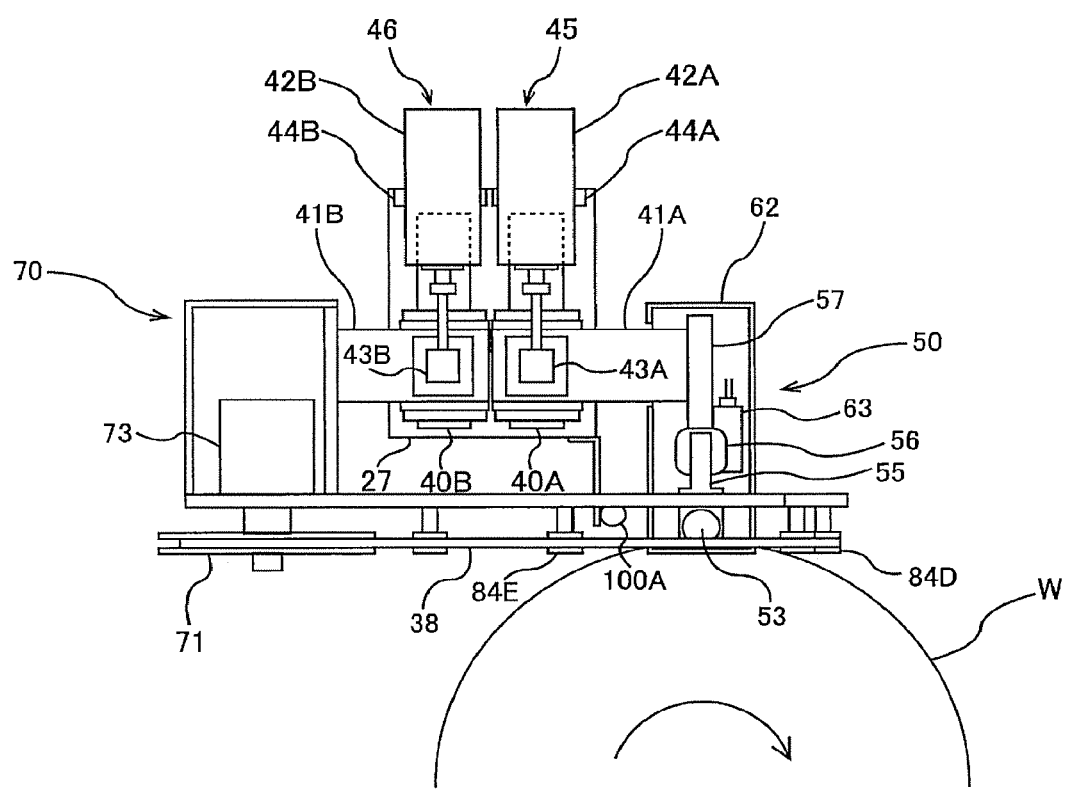
FIG. 17 is a view of the polishing head and the polishing-tape supply and collection mechanism that have been moved to predetermined polishing positions.

As shown in FIG. 17, when polishing the wafer W, the polishing head 50 and the polishing-tape supply and collection mechanism 70 are moved to their predetermined polishing positions, respectively, by the motors 42A and 42B and the ball screws 43A and 43B. The polishing tape 38 at the polishing position extends in the tangential direction of the wafer W as viewed from above the wafer W. Therefore, the polishing-tape supply and collection mechanism 70 serves as a polishing-tape supporting mechanism for supporting the polishing tape 38 in parallel with the surface of the wafer W such that the polishing tape 38 extends along the tangential direction of the wafer W.

Figure 18:
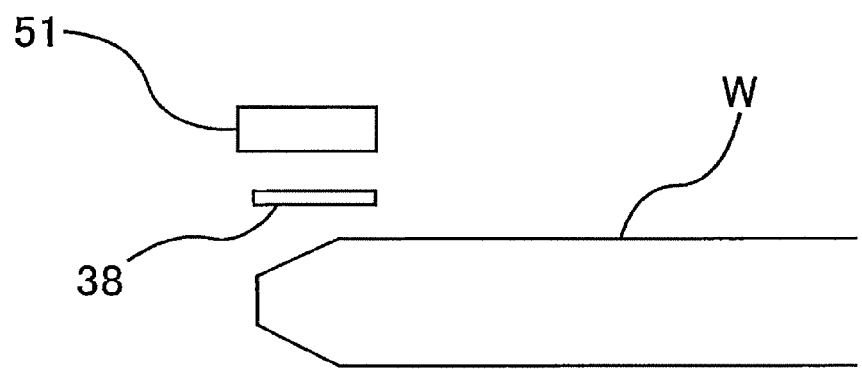
FIG. 18 is a schematic view of a pressing pad, a polishing tape, and a wafer at the polishing positions as viewed from a lateral direction.
Figure 19:
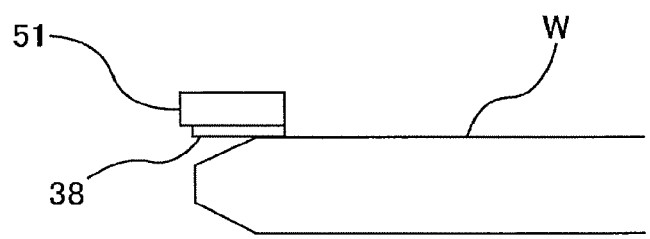
FIG. 19 is a view showing a state in which the pressing pad is pressing the polishing tape against the wafer.

FIG. 18 is a schematic view of the polishing pad 51, the polishing tape 38, and the wafer W at the polishing positions as viewed from the lateral direction. As shown in FIG. 18, the polishing tape 38 is located above the edge portion of the wafer W, and the pressing pad 51 is located above the polishing tape 38. The edge of the pressing pad 51 and the edge of the polishing tape 38 at their polishing positions coincide with each other. That is, the polishing head 50 and the polishing-tape supply and collection mechanism 70 are moved independently to their respective polishing positions such that the edge of the pressing pad 51 and the edge of the polishing tape 38 coincide with each other. FIG. 19 is a view showing a state in which the pressing pad 51 is pressing the polishing tape 38 against the wafer W.

The polishing tape 38 is a long and narrow strip-shaped polishing tool. Although a width of the polishing tape 38 is basically constant throughout its entire length, there may be a slight variation in the width of the polishing tape 38 in some parts thereof. As a result, the position of the edge of the polishing tape 38 at its polishing position may vary from wafer to wafer. On the other hand, the position of the pressing pad 51 at its polishing position is constant at all times. Thus, in order to enable the edge of the polishing tape 38 to coincide with the edge of the pressing pad 51, the position of the edge of the polishing tape 38 is detected by the above-described tape-edge detection sensor 100 before the polishing tape 38 is moved to its polishing position.

Figure 20A:
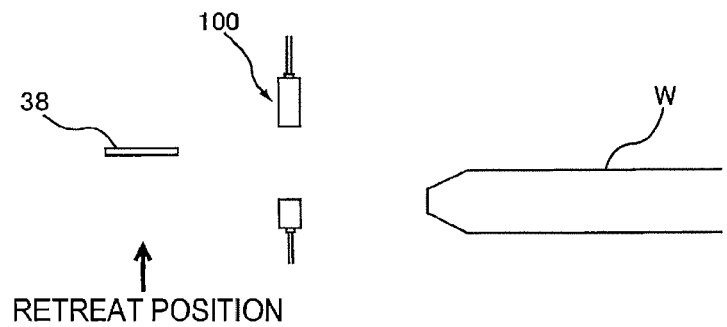
FIG. 20A, FIG. 20B, and FIG. 20C are views showing operations of detecting an edge of the polishing tape.
Figure 20B:
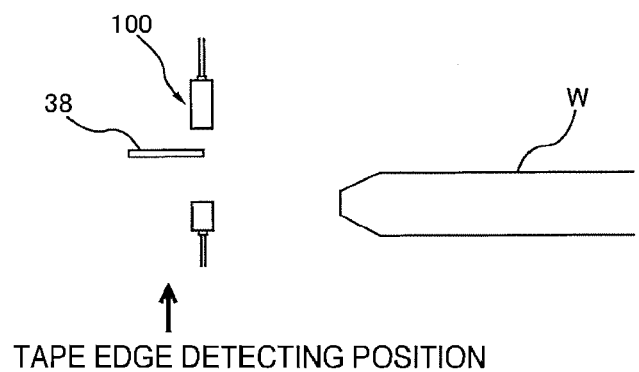
Figure 20C:
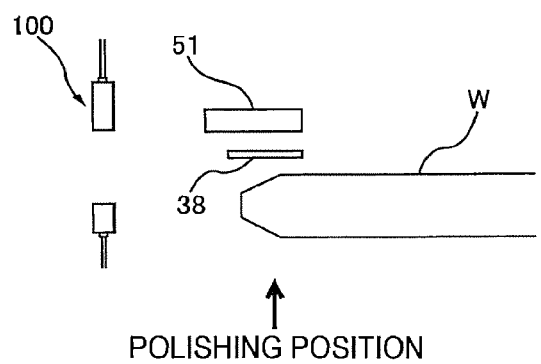

FIG. 20A through FIG. 20C are views illustrating operations for detecting the edge of the polishing tape 38. Prior to polishing of the wafer W, the polishing tape 38 is moved from a retreat position shown in FIG. 20A to a tape-edge detecting position shown in FIG. 20B. In this tape-edge detecting position, the position of the wafer-side edge of the polishing tape 38 is detected by the tape-edge detection sensor 100. Then, as shown in FIG. 20C, the polishing tape 38 is moved to the polishing position such that the edge of the polishing tape 38 coincides with the edge of the pressing pad 51. Because the polishing tape 38 is movable independently of the polishing head 50, the polishing tape 38 can be moved by a distance that can vary depending on the width of the polishing tape 38.

The position of the edge of the pressing pad 51 at the polishing position is stored in advance in the polishing controller 11 (see FIG. 8). Therefore, the polishing controller 11 can calculate the travel distance of the polishing tape 38 for allowing the edge of the polishing tape 38 to coincide with the edge of the pressing pad 51 from the detected edge position of the polishing tape 38 and the edge position of the pressing pad 51. In this manner, the travel distance of the polishing tape 38 is determined based on the detected position of the edge of the polishing tape 38. Therefore, the edge of the polishing tape 38 can be aligned with the edge of the pressing pad 51 regardless of a variation in the width of the polishing tape 38.

Next, polishing operations of the polishing apparatus having the above-described structures will be described. The following operations of the polishing apparatus are controlled by the polishing controller 11 shown in FIG. 8. The wafer W is held by the wafer holder 3 such that a film (e.g., a device layer) formed on the surface thereof faces upward, and further the wafer W is rotated about its center. Liquid (e.g., pure water) is supplied to the center of the rotating wafer W from a liquid supply nozzle (not shown in the drawings). The pressing pad 51 of the polishing head 50 and the polishing tape 38 are moved to the predetermined polishing positions, respectively, as shown in FIG. 18.

Figure 21A:
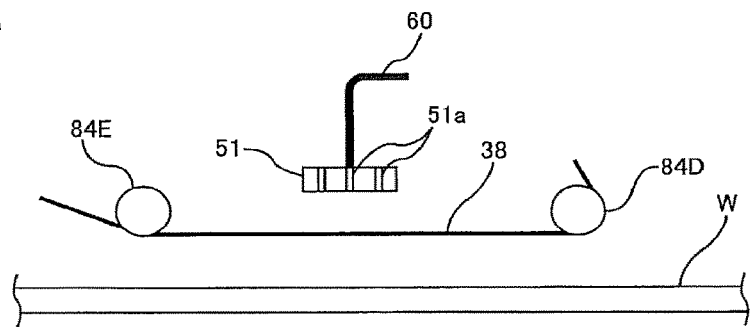
FIG. 21A is a view of the polishing tape and the pressing pad at the polishing positions as viewed from a radial direction of the wafer.
Figure 21B:
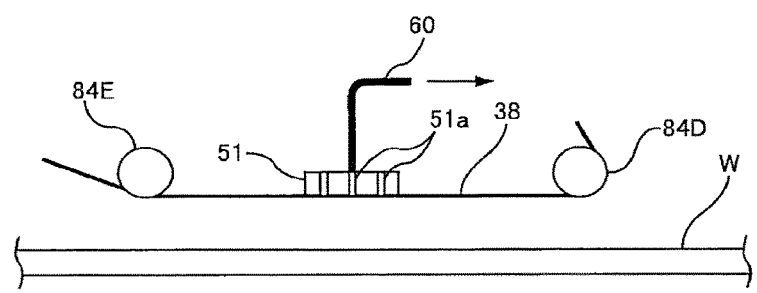
FIG. 21B is a view showing a state in which a lower surface of the pressing pad is in contact with an upper surface of the polishing tape.
Figure 21C:
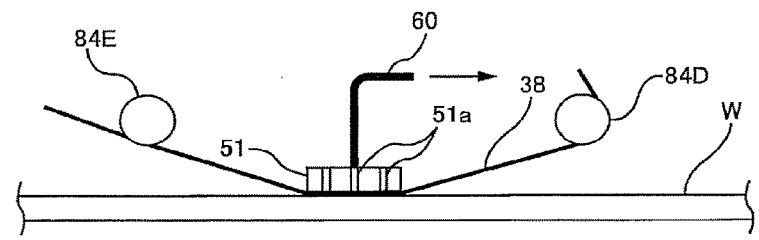
FIG. 21C is a view showing a state in which the pressing pad is pressing the polishing tape downwardly against the wafer.

FIG. 21A is a view of the polishing tape 38 and the pressing pad 51 at the polishing positions as viewed from the radial direction of the wafer W. The pressing pad 51 shown in FIG. 21A is in an upper position as a result of being elevated by the pneumatic cylinder 56 (see FIG. 15). In this position, the pressing pad 51 is located above the polishing tape 38. Subsequently, the operation of the pneumatic cylinder 56 is stopped and as a result a piston rod thereof is lowered. The pressing pad 51 is lowered until its lower surface contacts the upper surface of the polishing tape 38 as shown in FIG. 21B. In this state, the vacuum is produced in the through-holes 51a of the pressing pad 51 through the vacuum line 60 to enable the lower surface of the pressing pad 51 to hold the polishing tape 38. While holding the polishing tape 38, the pressing pad 51 is lowered by the pneumatic cylinder 53 (see FIG. 15) to press the polishing surface of the polishing tape 38 against the peripheral portion of the wafer W at a predetermined polishing pressure, as shown in FIG. 21C. The polishing pressure is a pressure applied from the polishing tape 38 to the edge portion of the wafer W. The polishing pressure can be adjusted by the pressure of the gas supplied to the pneumatic cylinder 53.

The edge portion of the wafer W is polished by the sliding contact between the rotating wafer W and the polishing tape 38. In order to increase the polishing rate of the wafer W, the polishing tape 38 and the pressing pad 51 may be oscillated in the tangential direction of the wafer W by the polishing-unit moving mechanism (tangentially-moving mechanism) 30 during polishing of the wafer W. During polishing, the liquid (e.g., pure water) is supplied onto the center of the rotating wafer W, so that the wafer W is polished in the presence of the water. The liquid, supplied to the wafer W, spreads over the upper surface of the wafer W in its entirety via a centrifugal force. This liquid can prevent polishing debris from contacting devices of the wafer W. As described above, during polishing, the polishing tape 38 is held on the pressing pad 51 by the vacuum suction. Therefore, a relative change in position between the polishing tape 38 and the pressing pad 51 is prevented. As a result, a polishing position and a polishing profile can be stable. Further, even when the polishing pressure is increased, the relative position between the polishing tape 38 and the pressing pad 51 does not change. Therefore, a polishing time can be shortened.

The vertical position of the pressing pad 51 during polishing of the wafer W is detected by the position sensor 63. Therefore, a polishing end point can be detected from the vertical position of the pressing pad 51. For example, polishing of the edge portion of the wafer W can be terminated when the vertical position of the pressing pad 51 has reached a predetermined target position. This target position is determined according to a target amount of polishing.

As shown in the step 2 through the step 5 in FIG. 2, the position of the polishing tape 38 relative to the surface of the wafer W can be determined from the vertical position of the pressing pad 51. The amount of change in the position of the polishing tape 38 from the surface of the wafer W corresponds to the amount of polishing of the wafer W. The measured value outputted from the position sensor 63 is sent to the polishing controller 11, which determines the position reference value from the measured value of the position of the pressing pad 51 and further determines the amount of polishing of the edge portion of the wafer W, as discussed with reference to FIG. 2. Instead of the position sensor 63, a displacement sensor may be used.

As discussed previously, the polishing controller 11 calculates the polishing rate during polishing of the wafer W, determines whether or not the calculated polishing rate falls within the predetermined range, and judges that the abnormality in polishing of the wafer W has occurred if the number of times the polishing rate goes beyond the predetermined range reaches a predetermined number.

When polishing of the wafer W is terminated, supply of the gas to the pneumatic cylinder 53 is stopped, whereby the pressing pad 51 is elevated to the position shown in FIG. 21B. At the same time, the vacuum suction of the polishing tape 38 is stopped. Further, the pressing pad 51 is elevated by the pneumatic cylinder 56 to the position shown in FIG. 21A. The polishing head 50 and the polishing-tape supply and collection mechanism 70 are moved to the retreat positions shown in FIG. 11. The polished wafer W is elevated by the wafer holder 3 and transported to the exterior of the polishing chamber 22 by hands of a non-illustrated transporting mechanism. Before polishing of the next wafer is started, the polishing tape 38 is advanced from the supply reel 71 to the collection reel 72 by a predetermined distance by the tape-advancing mechanism 76, so that a new polishing surface is used for polishing of the next wafer. When the polishing tape 38 is estimated to be clogged with the polishing debris, the polished wafer W may be polished again with the new polishing surface after the polishing tape 38 is advanced by the predetermined distance. Clogging of the polishing tape 38 can be estimated from, for example, the polishing time and the polishing pressure. Polishing of the wafer W may be performed while advancing the polishing tape 38 at a predetermined speed by the tape-advancing mechanism 76. It is possible to advance the polishing tape 38 in its longitudinal direction by the polishing-tape advancing mechanism 76 while holding the polishing tape 38 on the pressing pad 51 by the vacuum suction. The polishing tape 38 may not be held on the pressing pad 51 by the vacuum suction.

Figure 22A:
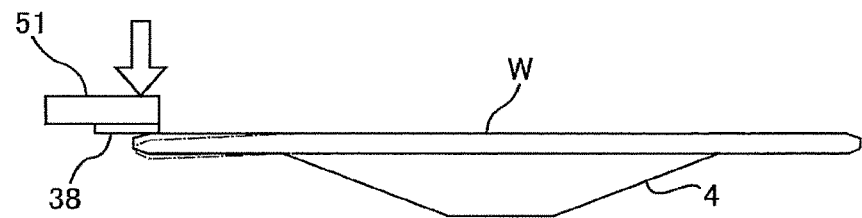
FIG. 22A is a view showing a state in which the wafer is bent as a result of being pressed by the pressing pad through the polishing tape.
Figure 22B:
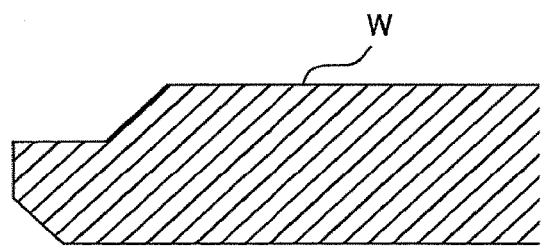
FIG. 22B is a cross-sectional view of the wafer that has been polished in the state shown in FIG. 22A.
Figure 23:
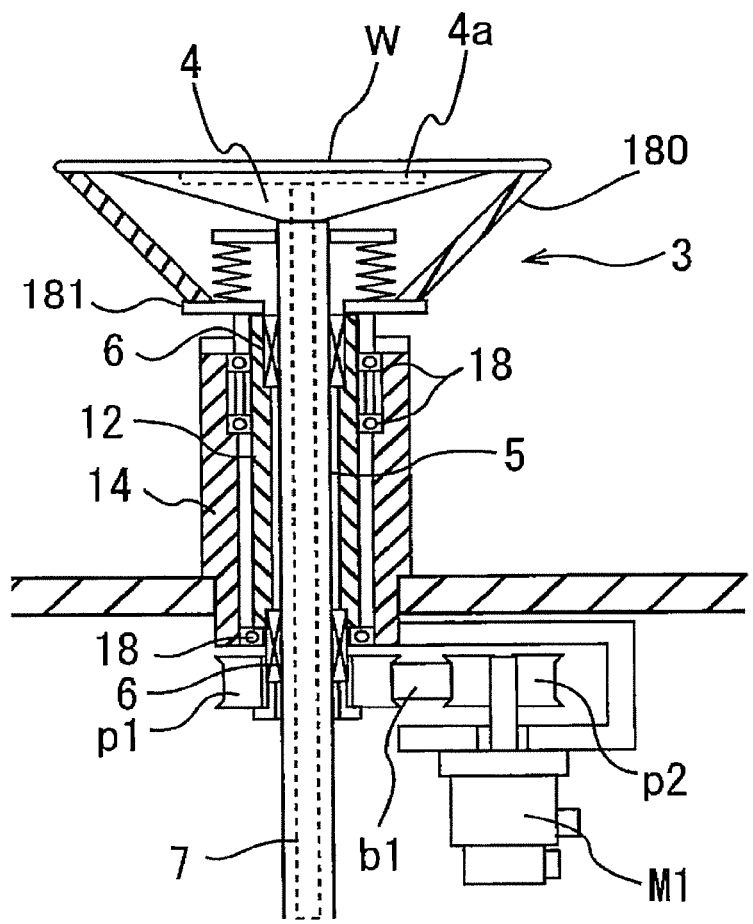
FIG. 23 is a vertical cross-sectional view showing the wafer holder having a supporting stage.

As shown in FIG. 22A, when an increased polishing pressure is exerted on the wafer W, the wafer W is greatly bent by the polishing pressure of the pressing pad 51, and as a result, an oblique polished surface is formed on the wafer W as shown in FIG. 22B. Thus, in an embodiment shown in FIG. 23 a supporting stage 180 for supporting a lower surface of the peripheral portion of the wafer W is provided in the wafer holder 3. The same parts as those shown in FIG. 9 will not be described below repetitively. The supporting stage 180 is fixed to a supporting stage base 181. This supporting stage base 181 is fixed to the upper end of the casing 12 and rotates in unison with the casing 12. Accordingly, the supporting stage 180 rotates in unison with the casing 12 and the holding stage 4.

Figure 24:
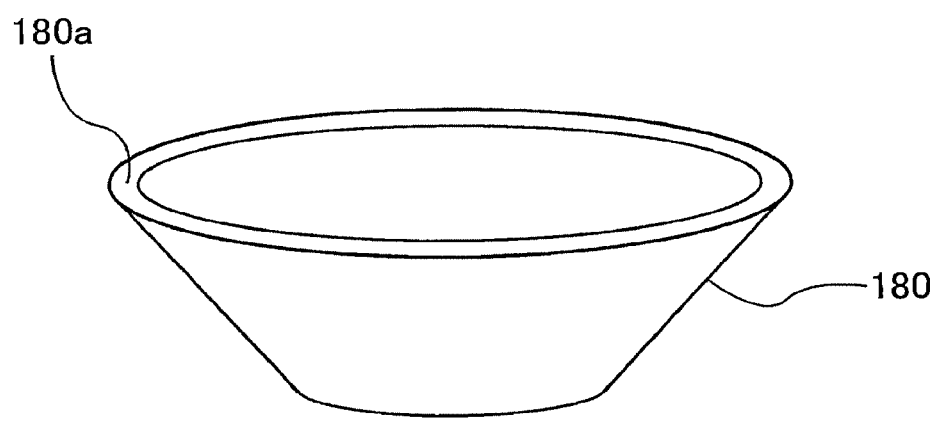
FIG. 24 is a perspective view of the supporting stage.

The supporting stage 180 has an inverted truncated cone shape as shown in FIG. 24 for supporting the lower surface of the peripheral portion of the wafer W in its entirety. The lower surface of the peripheral portion of the wafer W supported by the supporting stage 180 is a region including at least the bottom edge portion E2 shown in FIG. 30A and FIG. 30B. The supporting stage 180 has an annular upper surface 180a that provides a supporting surface for supporting the lower surface of the peripheral portion of the wafer W. When the wafer W is polished, an outermost edge of the supporting stage 180 and an outermost edge of the wafer W approximately coincide with each other.

Use of such supporting stage 180 can prevent the wafer W from being bent when the pressing pad 51 presses the polishing tape 38 against the wafer W. Therefore, the polishing tape 38 can polish the edge portion of the wafer W to form the vertical surface and the horizontal surface on the edge portion of the wafer W. Because the supporting stage 180 supports the lower surface of the peripheral portion of the wafer W in its entirety, the polishing tape 38 can polish the peripheral portion of the wafer W uniformly, compared with a case of using a conventional wafer supporting mechanism that supports only a part of the wafer.

Figure 25:
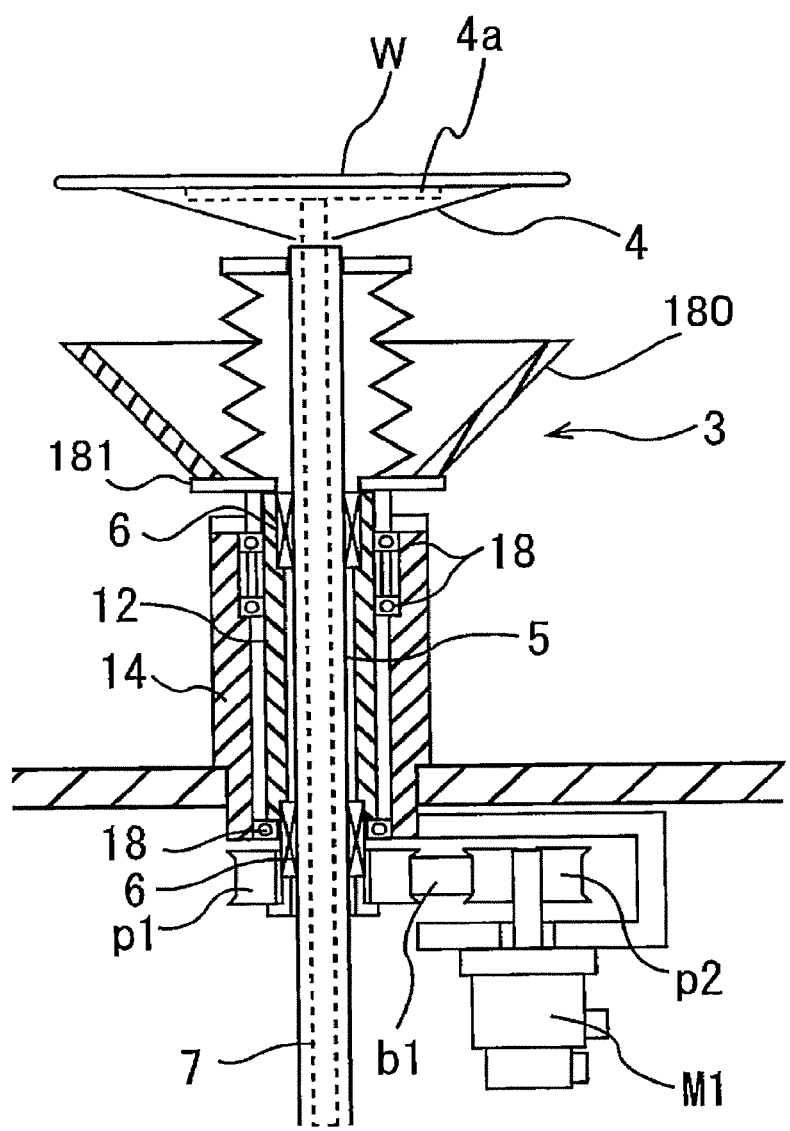
FIG. 25 is a view showing a state in which the holding stage and the wafer held on the upper surface of the holding stage are elevated relative to the supporting stage.

The ball spline bearings 6 are disposed between the hollow shaft 5 and the casing 12, so that the hollow shaft 5 can move up and down relative to the casing 12. Therefore, the holding stage 4 coupled to an upper end of the hollow shaft 5 can move up and down relative to the casing 12 and the supporting stage 180. FIG. 25 shows a state in which the holding stage 4 and the wafer W held on the upper surface of the holding stage 4 are elevated relative to the supporting stage 180.

Figure 26:
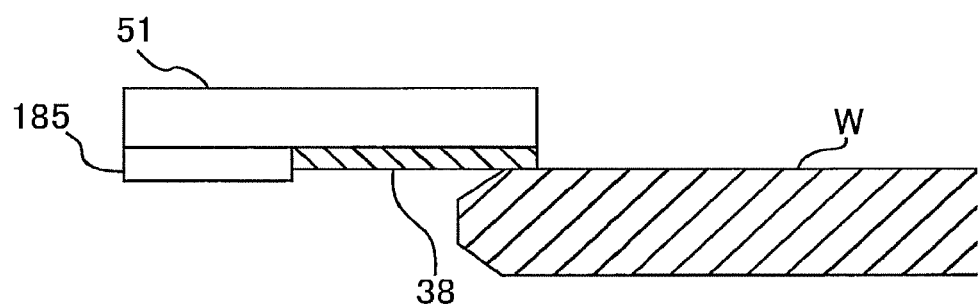
FIG. 26 is a view showing an embodiment having a tape stopper.

The polishing tape 38 may receive a horizontal load due to contact with the wafer W or an influence of the shape of the peripheral portion of the wafer W. As a result, the polishing tape 38 may be forced to move outwardly of the wafer W. Thus, a tape stopper 185 for restricting a horizontal movement of the polishing tape 38 is provided on the pressing pad 51 as shown in FIG. 26. The tape stopper 185 is arranged outwardly of the polishing tape 38 with respect to the radial direction of the wafer W so as to restrict an outward movement of the polishing tape 38. This tape stopper 185 can prevent the polishing tape 38 from moving outwardly of the wafer W. Therefore, a polishing profile and a polishing width of the wafer W can be stable.

Figure 27:
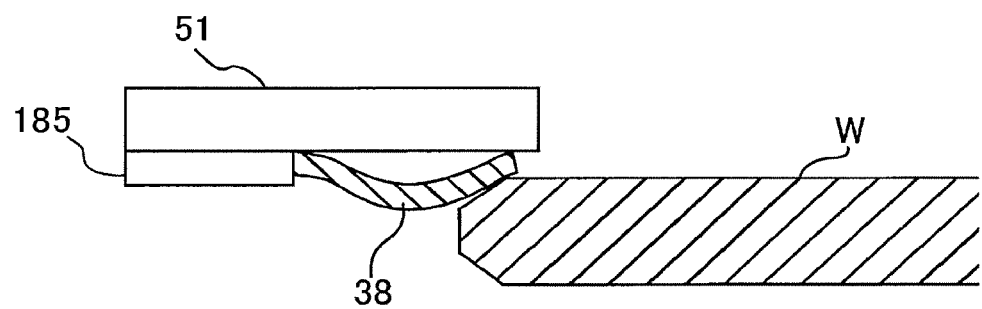
FIG. 27 is a view showing a state in which the polishing tape is distorted under a horizontal load.

When the tape stopper 185 receives the outward movement of the polishing tape 38, the polishing tape 38 may be distorted as shown in FIG. 27. Thus, in an embodiment shown in FIG. 28, in order to prevent the distortion of the polishing tape 38, a tape cover 186 is provided in proximity to the polishing surface of the polishing tape 38. The tape cover 186 is secured to the tape stopper 185 and is arranged so as to cover a large part of the polishing surface of the polishing tape 38. The tape cover 186 is located below the polishing tape 38 such that a small gap dg is formed between the polishing surface of the polishing tape 38 and an upper surface of the tape cover 186. The polishing tape 38 is arranged between the pressing pad 51 and the tape cover 186. By providing such tape cover 186, the polishing tape 38 can be prevented from being distorted and can be kept flat. Therefore, the polishing profile and the polishing width of the wafer W can be stable.

Figure 28:
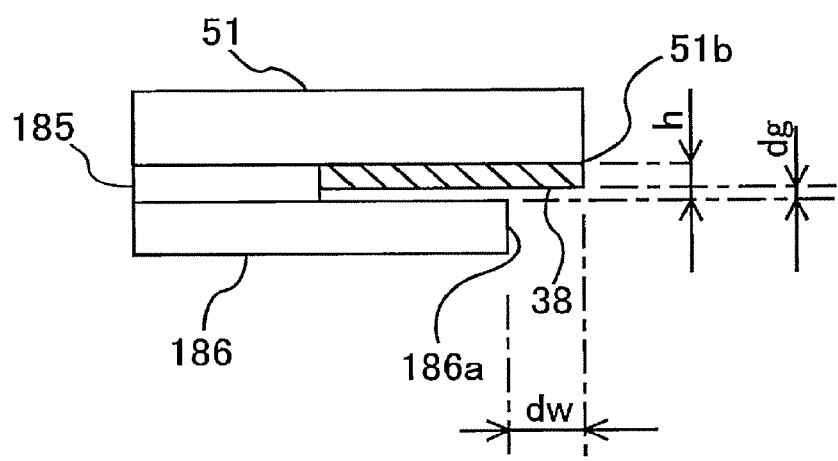
FIG. 28 is a view showing an embodiment having the tape stopper and a tape cover.

As shown in FIG. 28, the polishing tape 38 is located in a space surrounded by the pressing pad 51, the tape stopper 185, and the tape cover 186. A gap h between the lower surface of the pressing pad 51 and the upper surface of the tape cover 186 is larger than a thickness of the polishing tape 38. A gap dg between the polishing tape 38 and the tape cover 186 is smaller than a thickness of the wafer W.

The tape cover 186 has an inner side surface 186a located outwardly of the edge 51b of the pressing pad 51 with respect to the radial direction of the wafer W. Therefore, the polishing surface of the polishing tape 38 is exposed by a distance dw between the edge of the polishing tape 38 and the inner side surface 186a of the tape cover 186. Polishing of the wafer W is performed by this exposed polishing surface.

In the structures shown in FIG. 28, the tape stopper 185 receives the horizontal load acting on the polishing tape 38. As a result, the pressing pad 51 may move outwardly together with the polishing tape 38. Such a movement of the pressing pad 51 destabilizes the polishing profile and the polishing width. Thus, in an embodiment shown in FIG. 29, a movement-restricting mechanism for restricting the outward movement of the pressing pad 51 is provided. This movement-restricting mechanism has a projecting member 190 fixed to the pressing pad 51 and further has a side stopper 191 for restricting a horizontal movement of this projecting member 190. In this embodiment, a plunger is used as the projecting member 190.

The side stopper 191 is disposed outwardly of the plunger (projecting member) 190 with respect to the radial direction of the wafer W so as to receive an outward movement of the plunger 190. The side stopper 191 is secured to the lower surface of the box 62 of the polishing head 50, so that a position of the side stopper 191 is fixed. The plunger 190 and the side stopper 191 are arranged in proximity to each other, and a gap dr between the plunger 190 and the side stopper 191 is in a range of 10 µm to 100 µm. With this structure, when the pressing pad 51 moves outwardly upon receiving the horizontal load from the polishing tape 38 during polishing, the plunger 190 is brought into contact with the side stopper 191, whereby the outward movements of the pressing pad 51 and the polishing tape 38 are restricted. Therefore, the polishing profile and the polishing width of the wafer W can be stable.

Figure 29:
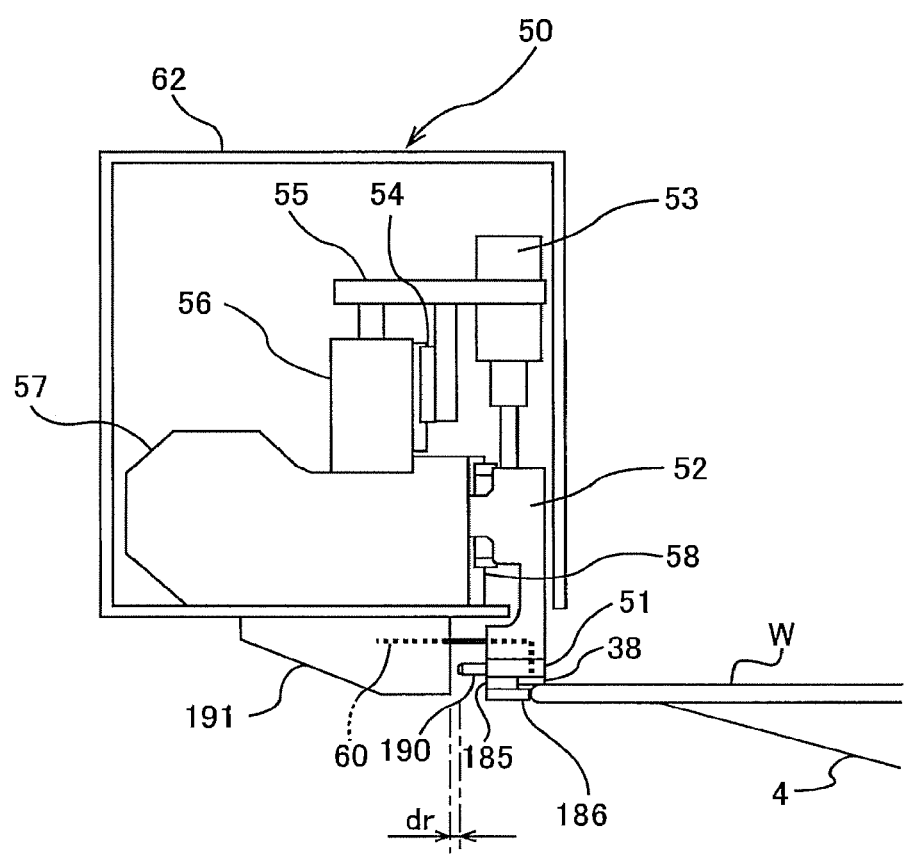
FIG. 29 is a view showing an embodiment having a movement-restricting mechanism for restricting an outward movement of the pressing pad.
Figure 30:
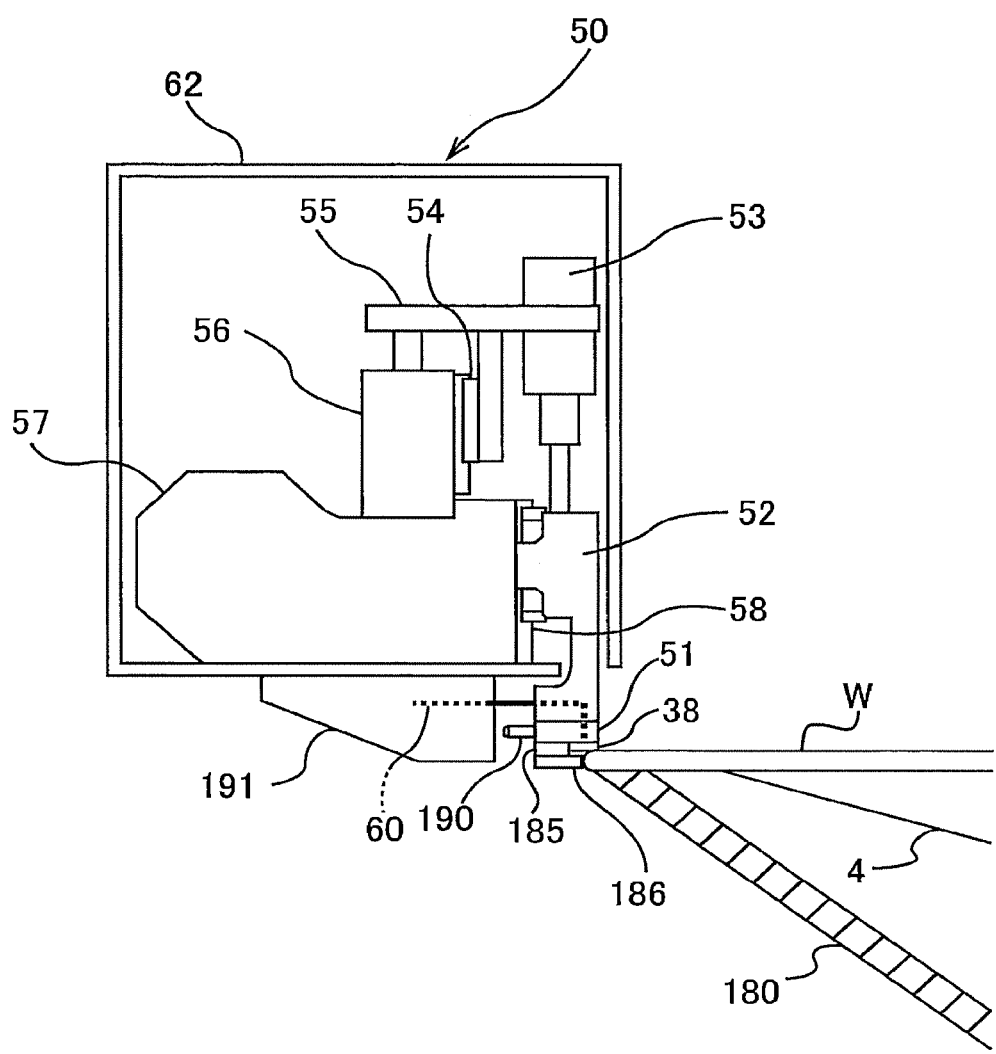
FIG. 30 is a view showing an example of a combination of the embodiment shown in FIG. 23 and the embodiment shown in FIG. 29.
Figure 31A:
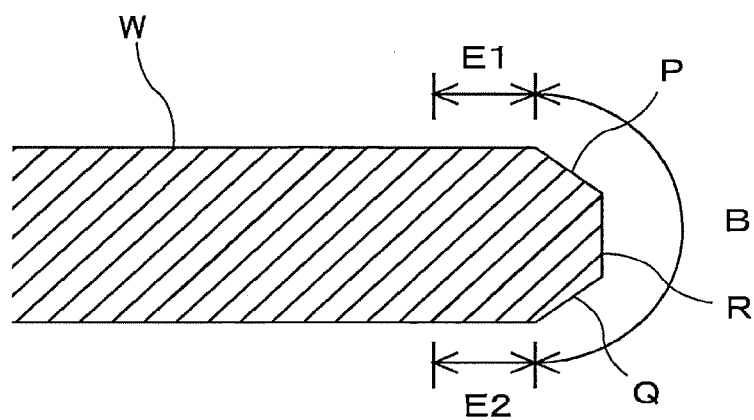
FIG. 31A and FIG. 31B are views each showing a peripheral portion of a wafer.
Figure 31B:
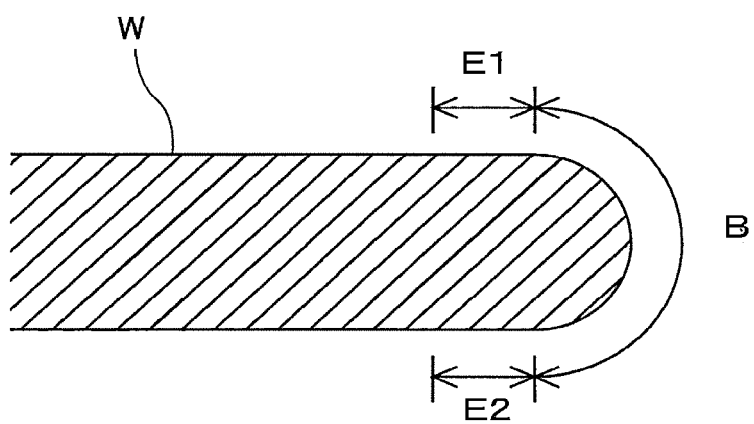
Figure 32:
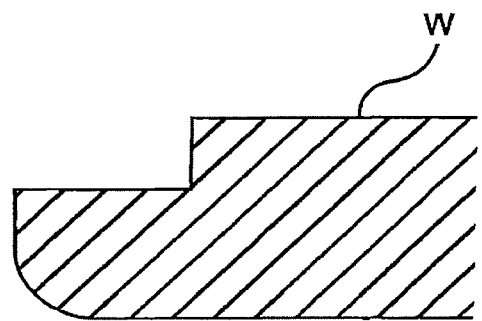
FIG. 32 is a view showing a vertical surface and a horizontal surface formed on the edge portion of the wafer.
Figure 33:
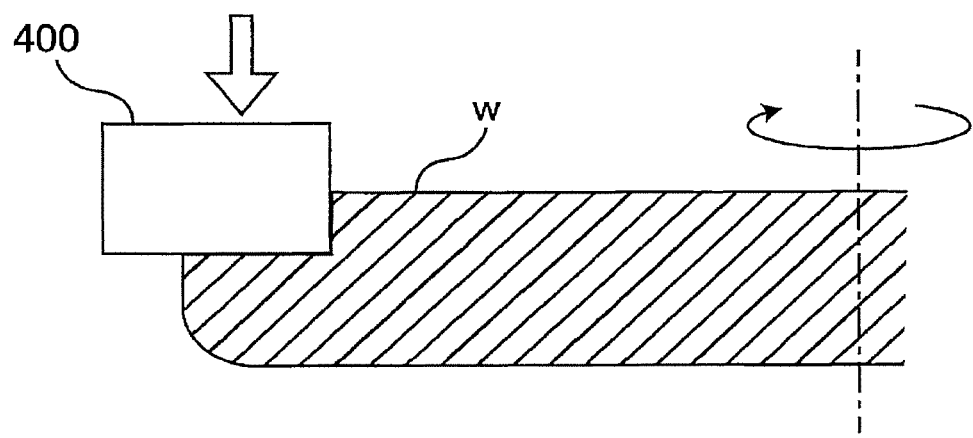
FIG. 33 is a view illustrating a polishing process for forming the vertical surface and the horizontal surface shown in FIG. 32.

The embodiments shown in FIG. 23 through FIG. 29 can be combined in an appropriate manner. For example, FIG. 30 shows an example in which the supporting stage 180 shown in FIG. 23 and the polishing head 50 shown in FIG. 29 are combined. This structure shown in FIG. 30 can prevent the deflection of the wafer W and can further prevent the movement and the distortion of the polishing tape 38.

While the above-discussed embodiments of the polishing apparatus use the polishing tape as the polishing tool, the present invention is not limited to such embodiments and can be applied to other polishing apparatus using a fixed abrasive (a grinding stone) as the polishing tool.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. An apparatus for detecting an abnormality in polishing of an edge portion of a substrate, said apparatus comprising:
   a substrate holder configured to rotate the substrate;
   a pressing device configured to press a polishing tool against the edge portion of the substrate to polish the edge portion;
   a measuring device configured to measure a position of the polishing tool relative to a surface of the substrate; and
   a controller configured to determine an amount of polishing of the substrate from the position of the polishing tool, calculate a polishing rate from the amount of polishing of the substrate, and judge whether or not an abnormality in polishing of the edge portion of the substrate has occurred, the abnormality occurring if a number of times the polishing rate goes beyond a predetermined range reaches a predetermined number.

2. The apparatus according to claim 1, wherein the controller is configured to terminate polishing of the edge portion of the substrate if the abnormality in polishing of the edge portion of the substrate is judged to have occurred.

3. The apparatus according to claim 1, wherein the controller is configured to generate an alarm if the abnormality in polishing of the edge portion of the substrate is judged to have occurred.

4. The apparatus according to claim 1, wherein the polishing tool is a polishing tape.

5. The apparatus according to claim 1, wherein the polishing tool is a fixed abrasive.

6. The apparatus according to claim 1, wherein the pressing device is configured to increase a pressure to be applied from the polishing tool to a subsequent substrate if the polishing rate is lower than the predetermined range.

7. The apparatus according to claim 1, wherein the substrate holder is configured to increase a rotational speed of a subsequent substrate if the polishing rate is lower than the predetermined range.

8. An apparatus for detecting an abnormality in polishing of a substrate, said apparatus comprising:
   a substrate holder configured to rotate the substrate;
   a pressing device configured to press a polishing tool against an edge portion of the substrate in a direction perpendicular to a surface of the substrate to polish the edge portion to form a horizontal surface which is parallel to the surface of the substrate and a vertical surface which is perpendicular to the surface of the substrate, the surface of the substrate being located more inwardly than the edge portion;
   a measuring device configured to measure a position of the polishing tool relative to the surface of the substrate; and
   a controller configured to determine an amount of polishing of the substrate from the position of the polishing tool, calculate a polishing rate from the amount of polishing of the substrate, and judge whether or not an abnormality in polishing of the edge portion of the substrate has occurred, the abnormality occurring if the polishing rate is out of a predetermined range, the occurrence of the abnormality indicating a non-flatness of the vertical surface.

9. The apparatus according to claim 8, wherein the controller is configured to terminate polishing of the edge portion of the substrate if the abnormality in polishing of the edge portion of the substrate is judged to have occurred.

10. The apparatus according to claim 8, wherein the controller is configured to generate an alarm if the abnormality in polishing of the edge portion of the substrate is judged to have occurred.

11. The apparatus according to claim 8, wherein the polishing tool is a polishing tape.

12. The apparatus according to claim 8, wherein the polishing tool is a fixed abrasive.

13. The apparatus according to claim 8, wherein the pressing device is configured to increase a pressure to be applied from the polishing tool to a subsequent substrate if the polishing rate is lower than the predetermined range.

14. The apparatus according to claim 8, wherein the substrate holder is configured to increase a rotational speed of a subsequent substrate if the polishing rate is lower than the predetermined range.

* * * * *